(12) United States Patent
Chuang et al.

(10) Patent No.: US 11,621,248 B2
(45) Date of Patent: Apr. 4, 2023

(54) BONDED WAFER DEVICE STRUCTURE AND METHODS FOR MAKING THE SAME

(71) Applicant: Taiwan Semiconductor Manufacturing Company Limited, Hsinchu (TW)

(72) Inventors: Harry-Hak-Lay Chuang, Zhubei (TW); Wen-Tuo Huang, Tainan (TW); Wei Cheng Wu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 7 days.

(21) Appl. No.: 17/218,401

(22) Filed: Mar. 31, 2021

(65) Prior Publication Data

US 2022/0320044 A1  Oct. 6, 2022

(51) Int. Cl.
*H01L 25/065* (2006.01)
*H01L 23/48* (2006.01)
*H01L 23/00* (2006.01)
*H01L 21/768* (2006.01)
(Continued)

(52) U.S. Cl.
CPC .... *H01L 25/0657* (2013.01); *H01L 21/76898* (2013.01); *H01L 22/12* (2013.01); *H01L 22/32* (2013.01); *H01L 23/481* (2013.01); *H01L 24/05* (2013.01); *H01L 24/08* (2013.01); *H01L 24/80* (2013.01); *H01L 25/50* (2013.01); *H01L 2224/05147* (2013.01); *H01L 2224/08145* (2013.01); *H01L 2224/8083* (2013.01); *H01L 2224/80895* (2013.01); *H01L 2224/80896* (2013.01); *H01L 2225/06541* (2013.01); *H01L 2225/06596* (2013.01)

(58) Field of Classification Search
CPC ....... H01L 22/32; H01L 23/481; H01L 24/05; H01L 24/08
See application file for complete search history.

(56) References Cited

U.S. PATENT DOCUMENTS

| 9,666,566 B1 * | 5/2017 | Chen | H01L 25/105 |
| 9,773,732 B2 * | 9/2017 | Chen | H01L 21/4846 |
| 11,393,735 B2 * | 7/2022 | Liu | H01L 25/50 |

(Continued)

FOREIGN PATENT DOCUMENTS

| CN | 103390647 A | * | 11/2013 | | H01L 23/4824 |
| CN | 109155301 A | * | 1/2019 | | H01L 23/528 |
| WO | WO-2021242321 A1 | * | 12/2021 | | H01L 23/564 |

*Primary Examiner* — Mamadou L Diallo
(74) *Attorney, Agent, or Firm* — Tarbury Law Group, PLLC

(57) ABSTRACT

Bonded wafer device structures, such as a wafer-on-wafer (WoW) structures, and methods of fabricating bonded wafer device structures, including an array of contact pads formed in an interconnect level of at least one wafer of the bonded wafer device structure. The array of contact pads formed in an interconnect level of at least one wafer may have an array pattern that corresponds to an array pattern of contact pads that is subsequently formed over a surface of the bonded wafer structure. The array of contact pads formed in an interconnect level of at least one wafer of the bonded wafer device structure may enable improved testing of individual wafers, including circuit probe testing, prior to the wafer being stacked and bonded to one or more additional wafers to form a bonded wafer structure.

20 Claims, 31 Drawing Sheets

(51) Int. Cl.
  *H01L 21/66* (2006.01)
  *H01L 25/00* (2006.01)

(56) References Cited

U.S. PATENT DOCUMENTS

| | | | | |
|---|---|---|---|---|
| 2004/0058520 | A1* | 3/2004 | Burrell | H01L 24/05 |
| | | | | 257/E21.508 |
| 2006/0207790 | A1* | 9/2006 | Choi | H01L 24/05 |
| | | | | 174/262 |
| 2007/0205508 | A1* | 9/2007 | Hsia | H01L 24/05 |
| | | | | 257/734 |
| 2010/0155932 | A1* | 6/2010 | Gambino | H01L 27/0688 |
| | | | | 257/713 |
| 2017/0194226 | A1* | 7/2017 | Chen | H01L 21/4846 |
| 2018/0122755 | A1* | 5/2018 | Nakamura | H03F 3/195 |
| 2018/0348907 | A1* | 12/2018 | Lee | H01L 27/323 |
| 2020/0043832 | A1* | 2/2020 | Mohamed | H01L 25/0657 |
| 2020/0105735 | A1* | 4/2020 | Park | H01L 27/11568 |
| 2020/0210800 | A1* | 7/2020 | Pinto | G06K 19/07732 |
| 2020/0243486 | A1* | 7/2020 | Quader | G06N 3/063 |
| 2020/0402951 | A1* | 12/2020 | Chen | H01L 27/10858 |
| 2021/0066224 | A1* | 3/2021 | Jang | H01L 27/14636 |
| 2021/0159212 | A1* | 5/2021 | Jing | H01L 23/5381 |
| 2021/0320075 | A1* | 10/2021 | Hou | H01L 25/50 |
| 2021/0335660 | A1* | 10/2021 | Chiu | H01L 21/823821 |
| 2021/0343668 | A1* | 11/2021 | Huang | H01L 23/3192 |
| 2021/0375790 | A1* | 12/2021 | Oda | H01L 25/0657 |
| 2021/0375847 | A1* | 12/2021 | Chibvongodze | G11C 5/025 |
| 2021/0391302 | A1* | 12/2021 | Kao | H01L 23/53257 |
| 2021/0391376 | A1* | 12/2021 | Chen | H01L 23/5384 |
| 2022/0068954 | A1* | 3/2022 | Kim | H01L 27/11582 |
| 2022/0093555 | A1* | 3/2022 | Hou | H01L 24/05 |
| 2022/0115423 | A1* | 4/2022 | Miller | H01L 27/14636 |
| 2022/0122932 | A1* | 4/2022 | Oh | G11C 16/08 |
| 2022/0139851 | A1* | 5/2022 | Chang | H01L 25/0657 |
| | | | | 257/734 |
| 2022/0149002 | A1* | 5/2022 | Hou | H01L 24/80 |
| 2022/0199517 | A1* | 6/2022 | Dabral | H01L 24/16 |
| 2022/0199559 | A1* | 6/2022 | Fang | H01L 24/81 |
| 2022/0216155 | A1* | 7/2022 | Won | H01L 25/0657 |

\* cited by examiner

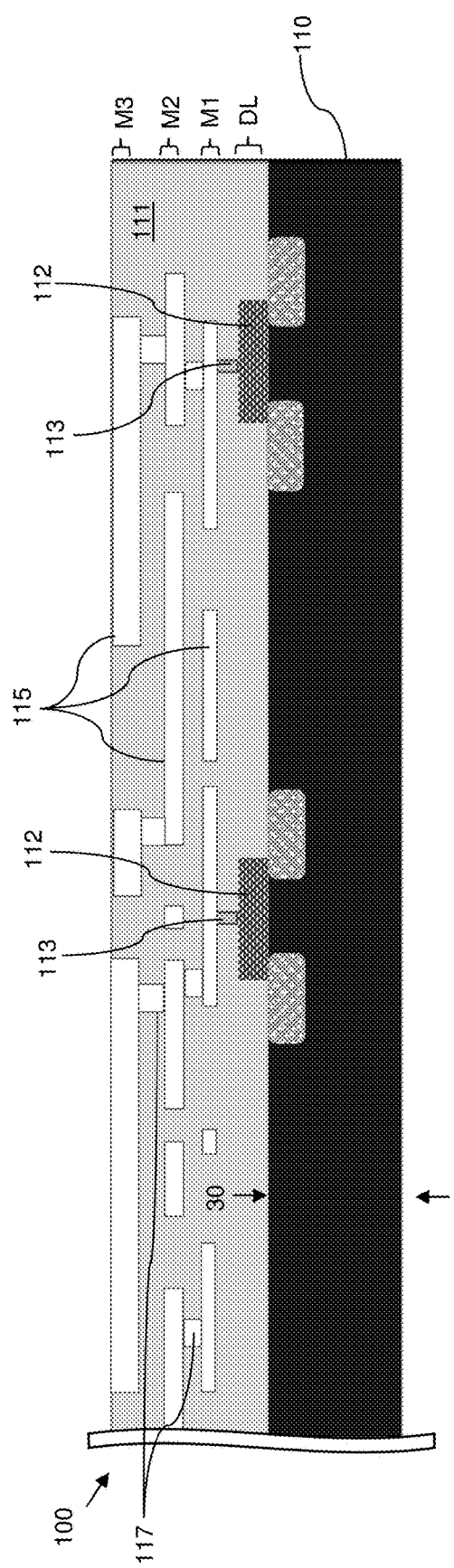
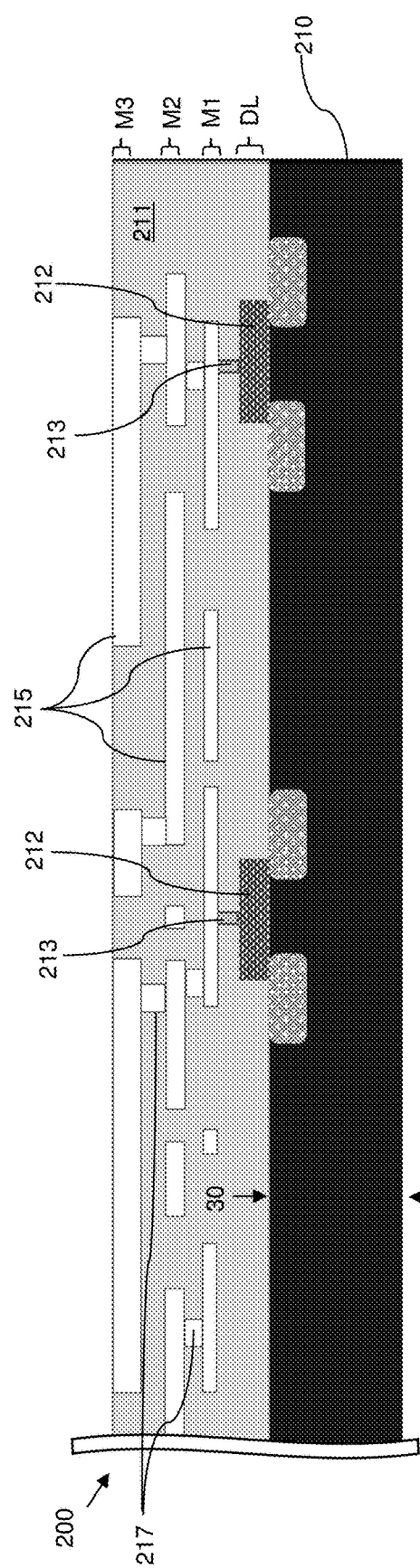
FIG. 1A
FIG. 1B

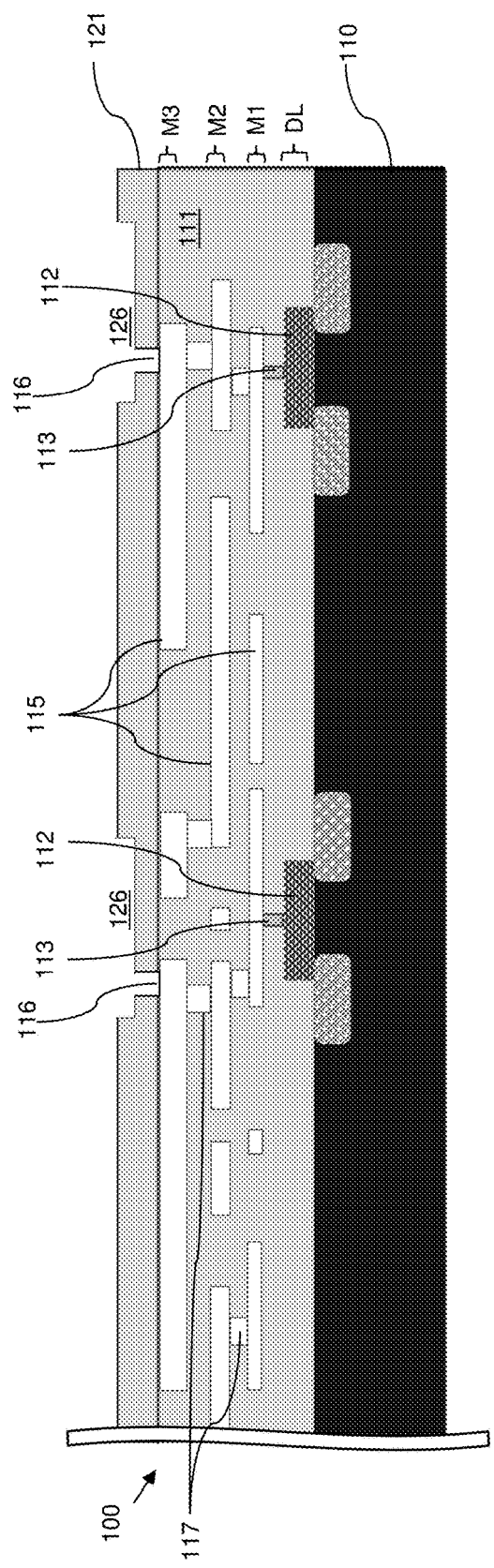
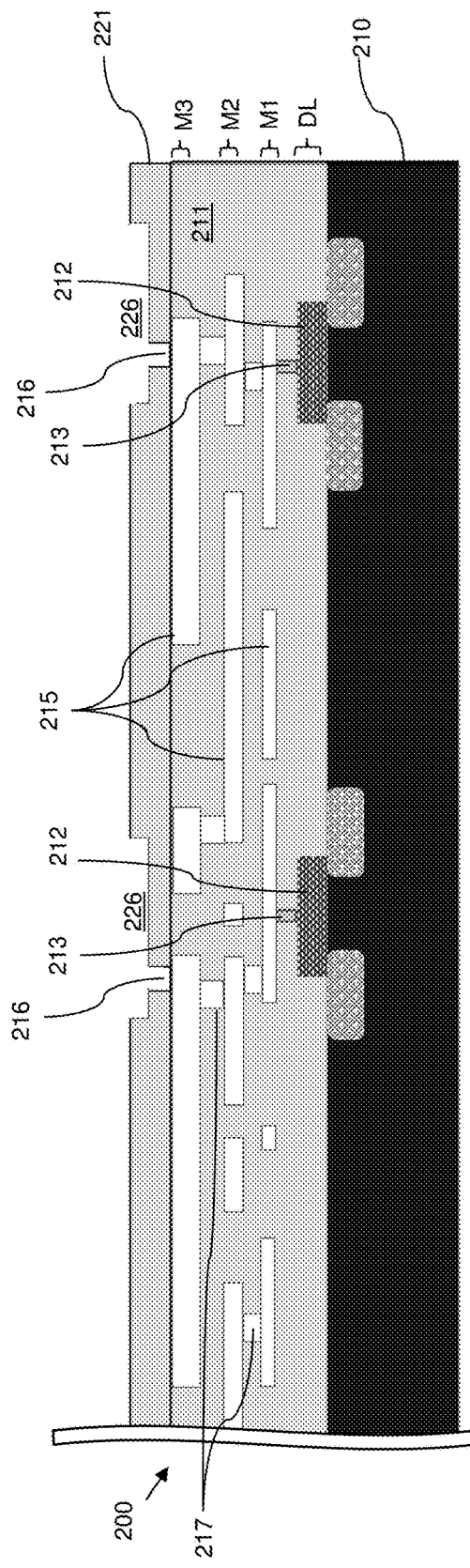
FIG. 4A
FIG. 4B

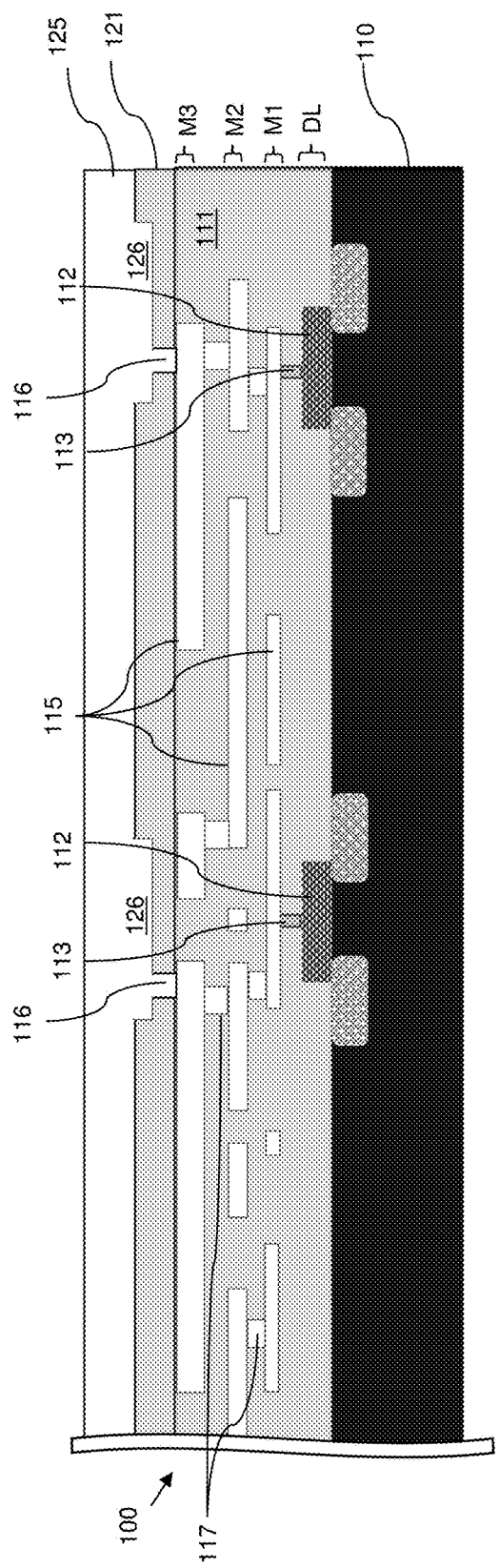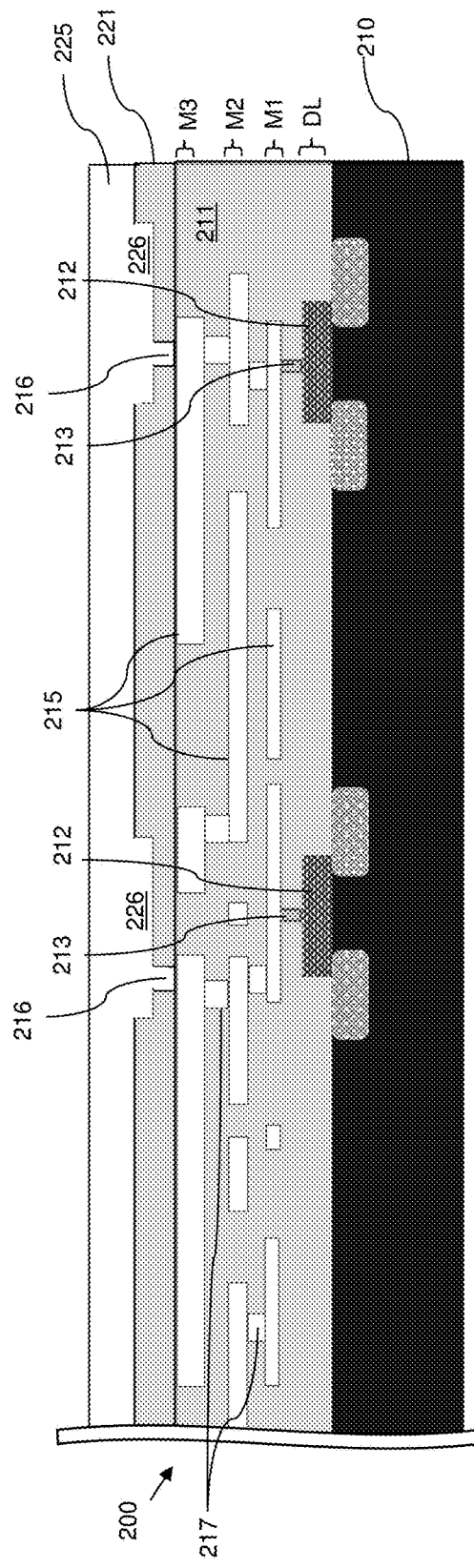

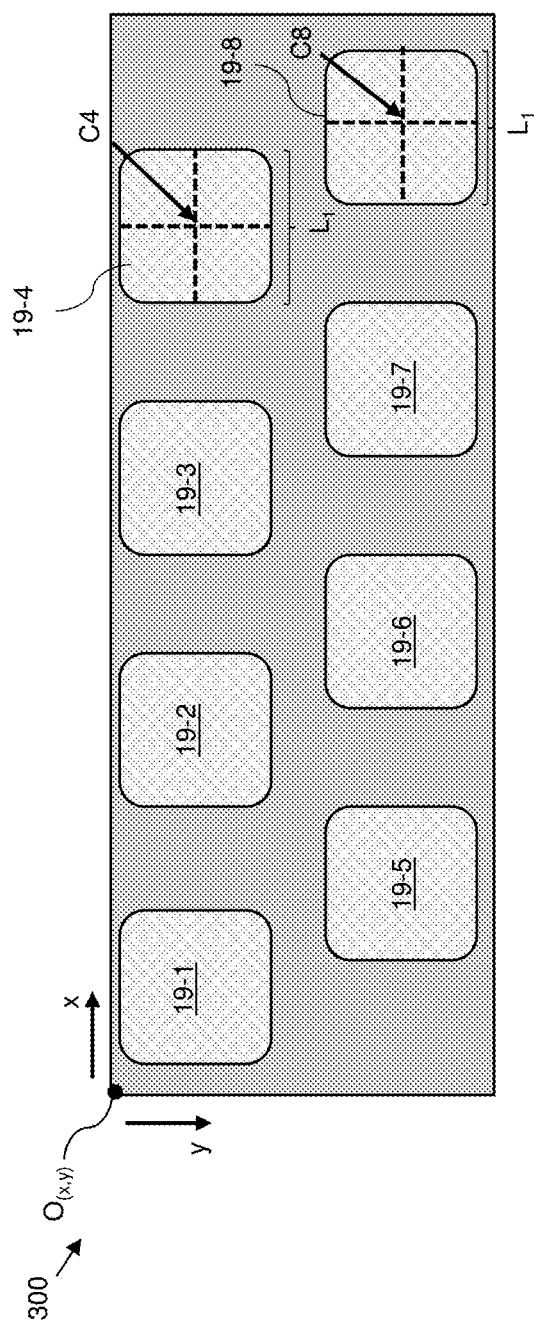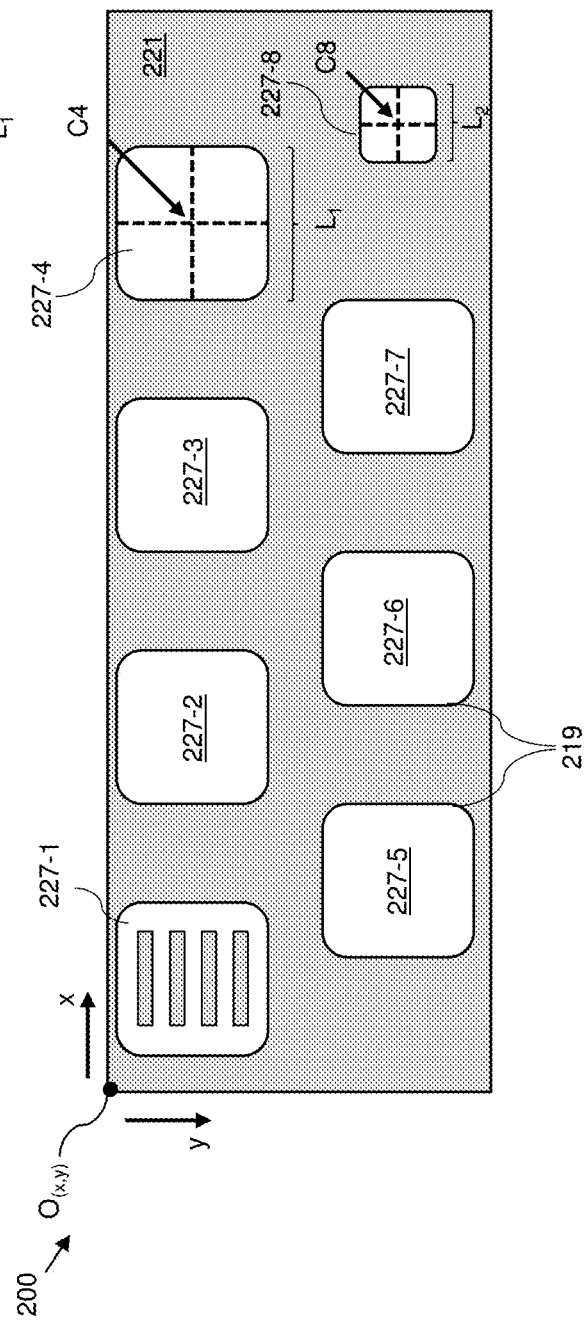

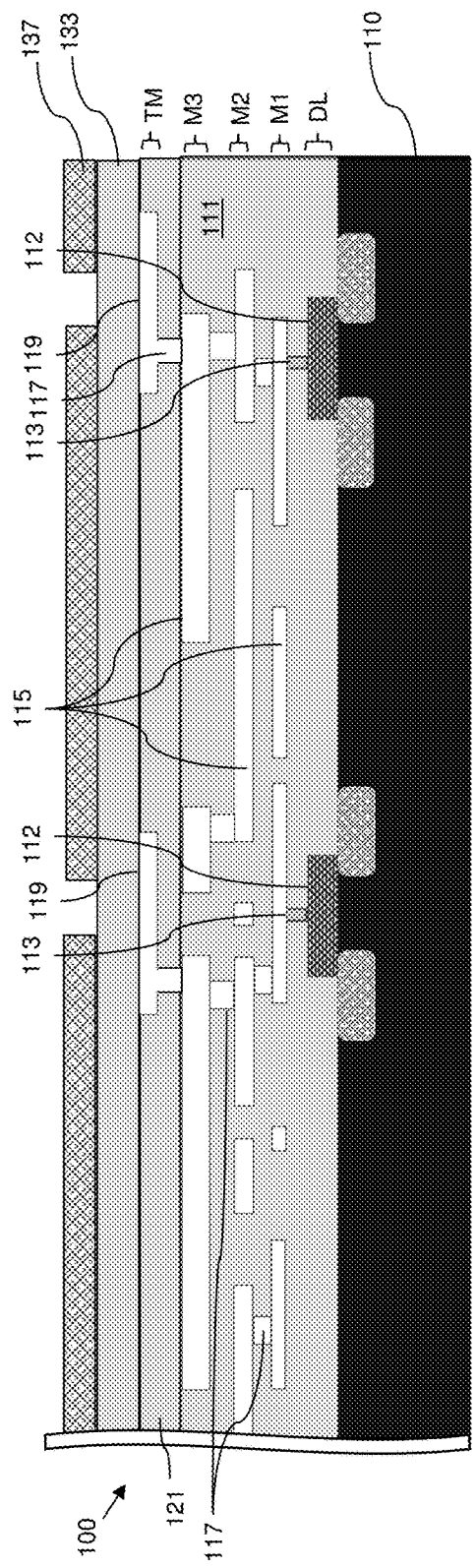
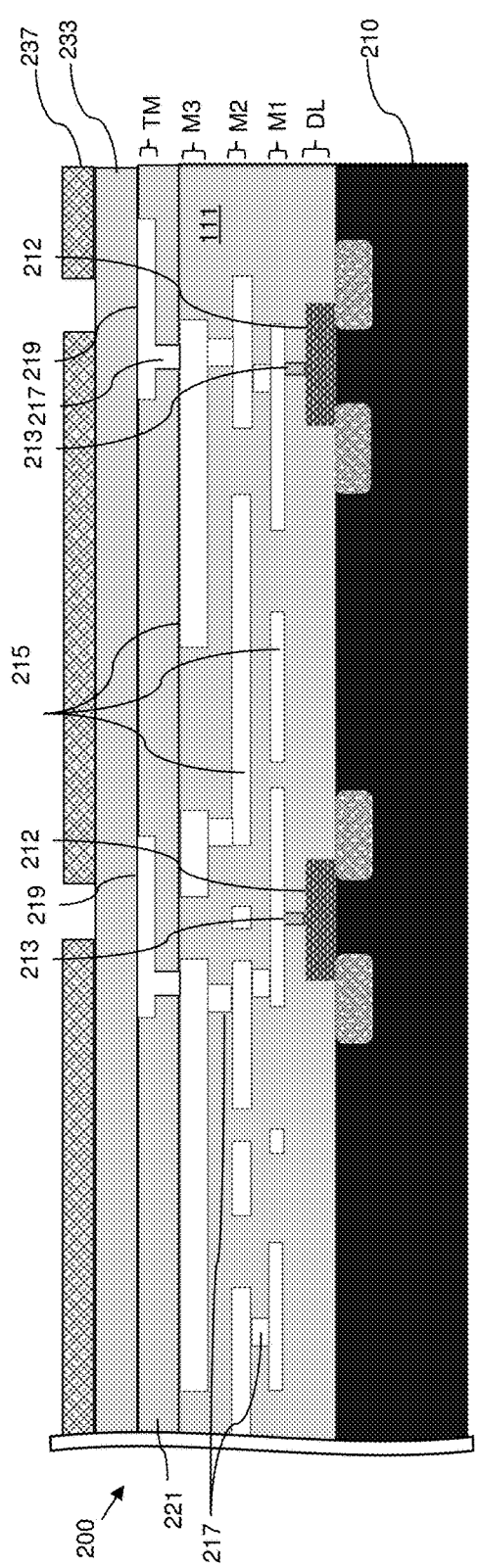
FIG. 10A
FIG. 10B

BONDED WAFER DEVICE STRUCTURE AND METHODS FOR MAKING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

Higher density of electronic components may also be achieved by fabricating three-dimensional (3D) integrated circuit (IC) device structures. Some 3D device structures, such as Wafer-on-Wafer structures, include stacking and bonding multiple IC devices (i.e., chips) on the semiconductor wafer level. Such 3D bonded wafer device structures may provide improved integration density and other advantages, such as faster speeds and higher bandwidth, because of the decreased length of interconnects between the stacked chips. However, there are many challenges related to 3D devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a vertical cross-section view of a portion of a first wafer including a first plurality of devices and interconnect structures formed on a semiconductor material substrate according to an embodiment of the present disclosure.

FIG. 1B is a vertical cross-section view of a portion of a second wafer including a second plurality of devices and interconnect structures formed on a semiconductor material substrate according to an embodiment of the present disclosure.

FIG. 4A is a vertical cross-section view of a portion of a first wafer including a plurality of trench openings formed in a dielectric material layer according to an embodiment of the present disclosure.

FIG. 4B is a vertical cross-section view of a portion of a second wafer including a plurality of trench openings formed in a dielectric material layer according to an embodiment of the present disclosure.

FIG. 5A is a vertical cross-section view of a portion of a first wafer including a layer of metal material deposited over a dielectric material layer and filling a plurality of trenches and via openings in the dielectric material layer according to an embodiment of the present disclosure.

FIG. 5B is a vertical cross-section view of a portion of a second wafer including a layer of metal material deposited over a dielectric material layer and filling a plurality of trenches and via openings in the dielectric material layer according to an embodiment of the present disclosure.

FIG. 8A is a top view of a portion of a bonded wafer structure showing an array of contact pads of the bonded wafer structure according to an embodiment of the present disclosure.

FIG. 8B is a top view of a portion of a top metal layer of a wafer for a bonded wafer structure showing a plurality of metal features including an array of contact pads according to an embodiment of the present disclosure.

FIG. 10A is a vertical cross-section view of a portion of a first wafer including a dielectric material layer deposited over a top metal level and a patterned mask formed over dielectric material layer according to an embodiment of the present disclosure.

FIG. 10B is a vertical cross-section view of a portion of a second wafer including a dielectric material layer deposited over a top metal level and a patterned mask formed over dielectric material layer according to an embodiment of the present disclosure.

DETAILED DESCRIPTION

Figure 2A:
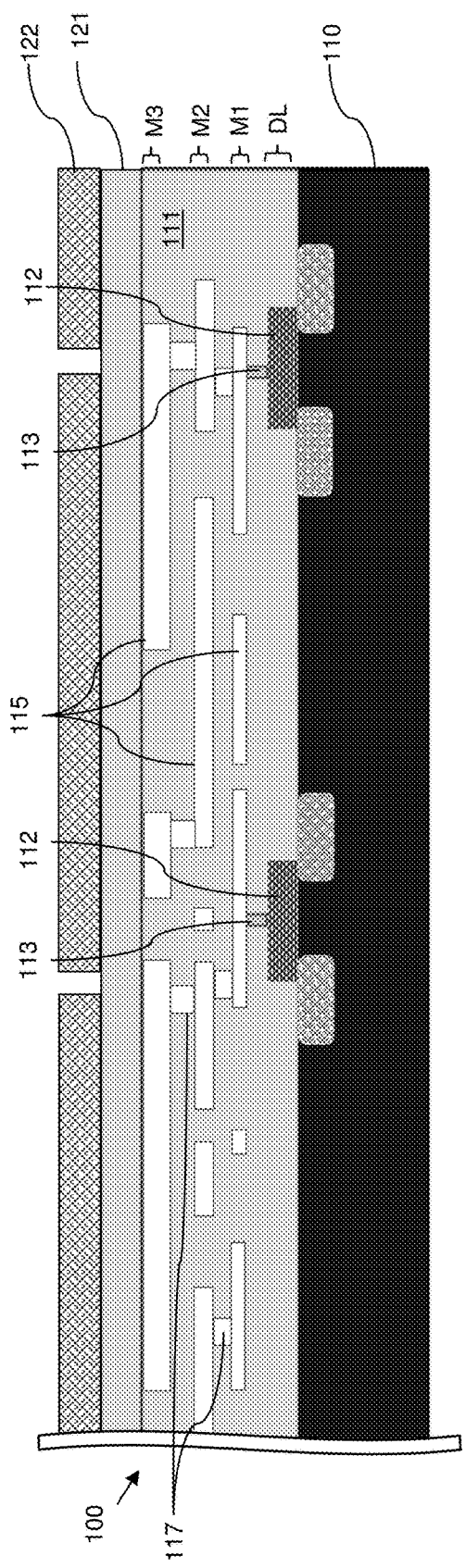
FIG. 2A is a vertical cross-section view of a portion of a first wafer including a dielectric material layer deposited over an interconnect structure and a patterned mask formed over the dielectric material layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to bonded wafer device structures, such as a wafer-on-wafer (WoW) structure, and methods of fabricating bonded wafer device structures, that include an array of contact pads formed in an interconnect level of at least one wafer of the bonded wafer device structure. In various embodiments, the array of contact pads may enable improved testing of individual wafers, including circuit probe testing, prior to the wafer being stacked and bonded to one or more additional wafers to form a bonded wafer structure.

In the conventional process for fabricating a bonded wafer structure, such as a WoW structure, the functional performance of the individual wafers is generally not known prior to stacking and bonding of the wafers. Circuit probe testing, for example, may only be performed after the wafers have been stacked and bonded to one another to form a bonded wafer structure, and contact pads have been formed on the bonded wafer structure. However, if one of the wafers used to form the bonded wafer structure is defective, then the entire bonded wafer structure may also be defective, and may need to be discarded. This may significantly lower productivity and increase the costs associated with the fabrication of bonded wafer structures.

Accordingly, there is a need for bonded wafer structures, and methods of fabricating bonded wafer structures, that enable improved testing of individual wafers before the wafers are stacked and bonded to one another to form a bonded wafer structure. Various embodiments disclosed herein include forming an array of contact pads in an interconnect level of a wafer prior to stacking and bonding the wafer to one or more additional wafers to form a bonded wafer structure. In some embodiments, the array of contact pads may have an array pattern that corresponds to an array pattern of the contact pads that are subsequently formed on the bonded wafer structure. This may enable more comprehensive testing, including circuit probe testing, to be performed on individual wafers prior to forming the bonded wafer structure, which may enable earlier identification of defective wafers, improved yields, and lower costs for fabrication of bonded wafer structures.

FIGS. 1A-6B and 10A-30 are sequential vertical cross-sectional views of an exemplary structure during a process of forming a bonded wafer device structure, such as a WoW structure, according to various embodiments of the present disclosure. The bonded wafer device structure may include a plurality of wafers, each of which may include device structures and interconnect structures formed on a substrate. The wafers may be vertically stacked and bonded together to form an integrated bonded wafer device structure. In some embodiments, a plurality of contact pads may be formed through at least one substrate of the bonded wafer device structure. In some embodiments, the bonded wafer device structure may be singulated (e.g., diced) to provide a plurality of integrated circuit (IC) chips. Although the exemplary embodiment shown in FIGS. 1A-6B and 10A-30 illustrate a process of forming a bonded wafer device structure having two wafers, various bonded wafer device structures, and methods of forming such structures, that include more than two wafers are also within the contemplated scope of disclosure.

FIG. 1A is a vertical cross-section view of a portion of a first wafer 100, and FIG. 1B is a vertical cross-section view of a portion of a second wafer 200 in accordance with various embodiments of the present disclosure. Referring to FIGS. 1A and 1B, the first wafer 100 and the second wafer 200 may each include a substrate 110, 210, a plurality of device structures 112, 212, and a plurality of interconnect structures 111, 211, 113, 213, 115, 215, 117, 217 located on or over a first surface 30 of the substrate 110, 210.

Each of the first substrate 110 and the second substrate 210 may be a semiconductor material substrate that may include an elementary semiconductor such as silicon or germanium and/or a compound semiconductor such as silicon germanium, silicon carbide, gallium arsenic, indium arsenide, gallium nitride, or indium phosphide, or combinations of the same. Other semiconductor substrate materials are within the contemplated scope of disclosure. In some embodiments, the first substrate 110 and/or the second substrate 210 may be a semiconductor-on-insulator (SOI) substrate. In some embodiments, at least one of first substrate 110 and the second substrate 210 may be a supporting substrate made of quartz, glass, or the like. In various embodiments, the first substrate 110 and the second substrate 210 may include the same material(s), or may include different materials.

In various embodiments, the first substrate 110 and/or the second substrate 210 may take the form of a planar substrate, a substrate with multiple fins, nanowires, or other forms known to people having ordinary skill in the art. Depending on the requirements of design, the first substrate 110 and/or the second substrate 210 may be a P-type semiconductor substrate or an N-type semiconductor material substrate and may have doped regions therein. The doped regions may be configured for an N-type device or a P-type device.

The first substrate 110 and the second substrate 210 may each include a first major surface (i.e., a front side 30) and a second major surface (i.e., a back side 40). In some embodiments, the first substrate 110 and/or the second substrate 210 may include isolation structures defining at least one active area on the front side 30 of the substrate 110, 210, and a first device level (DL) may be disposed on/in the active area. The first device level (DL) may include a variety of devices 112, 212. In some embodiments, the devices 112, 212 may include active components, passive components, or a combination thereof. In some embodiments, the devices 112, 212 may include integrated circuit devices. The devices 112, 212 may be, for example, transistors, capacitors, resistors, diodes, photodiodes, fuse devices, or other similar devices. In some embodiments, the first device level (DL) may include gate electrodes, source/drain regions, spacers, and the like.

The first substrate 110 and the second substrate 210 may each further include an interconnect structure located over the front side 30 of the substrate 110, 210. Each of the interconnect structures may include a dielectric material 111, 211, which may include at least one inter-layer dielectric (ILD) layer and/or at least one inter-metal dielectric (IMD) layer, and metal features 115, 215, 117, 217 that may be located at least partially within the dielectric material 111, 211. The dielectric material 111, 211 may be formed of dielectric materials such as silicon oxide ($SiO_2$) silicon nitride (SiN, $Si_3N_4$), silicon carbide (SiC), or the like. Other dielectric materials are within the contemplated scope of disclosure. The dielectric material 111, 211 may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

The metal features of the interconnect structures may include any of a variety of via structures 117, 217 and metal lines 115, 215. The metal features may be formed of any suitable electrically conductive material, such as tungsten (W), copper (Cu), a copper alloy, aluminum (Al), an aluminum alloy, combinations thereof, or the like. Other electrically conductive materials are within the contemplated scope of disclosure. In some embodiments, barrier layers (not shown) may be disposed between the metal features and the dielectric material 111 to prevent diffusion of the material of the metal features 115, 215, 117, 217 to surrounding features. The barrier layer may include Ta, TaN, Ti, TiN, CoW, or combinations thereof, for example. Other barrier layer materials are within the contemplated scope of disclosure.

The metal features 115, 215, 117, 217 may be configured to route electrical signals to and from, and/or in between, various devices 112, 212 of the wafer 100, 200, some or all of which may be located on the first device level DL. In various embodiments, the interconnect structure of each wafer 100, 200 may include a plurality of interconnect-level structures, where each interconnect-level structure may include a layer of dielectric material 111, 211 and a plurality of metal lines 115, 117 formed in the layer of dielectric material 111, 211. As shown in FIGS. 1A and 1B, for example, the interconnect structure of each wafer 100, 200 may include a plurality of metal levels (M1, M2, M3, etc.), where each metal level may include a plurality of metal lines 115 embedded in a dielectric material 111. A first metal level (M1) may be located over the first device level (DL). A plurality of device contact via structures 113, 213 may electrically connect the devices 112, 212 of the first device level (DL) to metal lines 115, 215 of the first metal level (M1). Additional metal levels (M2, M3, etc.) may be located over the first metal level (M1). Each of the metal levels may be separated by a layer of dielectric material 111, 211. Via structures 117, 217 may extend through the layer(s) of dielectric material 111, 211 to electrically connect metal lines 115, 217 of the different metal levels. Although wafers 100, 200 shown in FIGS. 1A and 1B include an interconnect structure having three metal levels (M1, M2, M3), it will be understood that an interconnect structure according to various embodiments may have a greater or lesser number of metal levels. In addition, although in various exemplary embodiments shown herein, the first wafer 100 and the second wafer 200 include interconnect structures having the same number of metal levels, it will be understood that the interconnect structures of the first wafer 100 and the second wafer 200 may have a different number of metal levels.

FIGS. 2A-6B are sequential side cross-section views illustrating a process of forming a top metal level (TM) on a first wafer 100 and a top metal level (TM) on a second wafer 200, respectively. In various embodiments, the top metal level (TM) of at least one of the first wafer 100 and the second wafer 200 may be formed to include an array of top metal contact pads. In embodiments, the top metal contact pads may have an array pattern that corresponds to an array pattern of contact pads that are subsequently formed on a bonded wafer device structure that includes the first wafer 100 and the second wafer 200. The array of top metal contact pads may enable improved processes for testing of wafers, including performing circuit probe testing on individual wafers, prior to the wafers being bonded to form a bonded wafer device structure. This may provide early detection of defective or otherwise non-conforming wafers, and may reduce risk and costs associated with fabrication of bonded wafer devices.

Figure 2B:
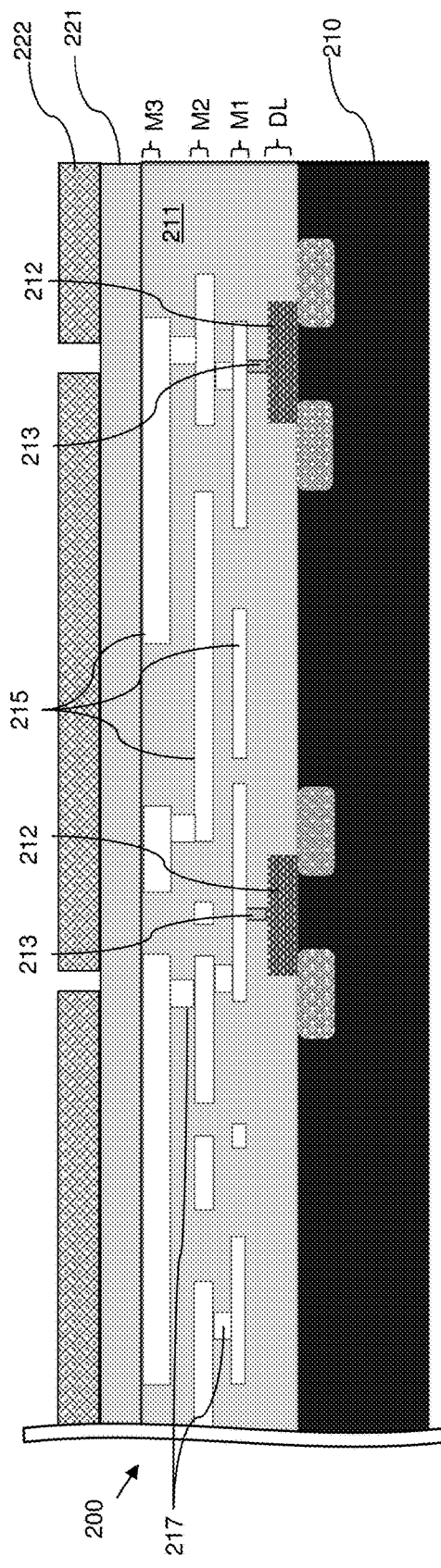
FIG. 2B is a vertical cross-section view of a portion of a second wafer including a dielectric material layer deposited over an interconnect structure and a patterned mask formed over the dielectric material layer according to an embodiment of the present disclosure.

Referring to FIGS. 2A and 2B, dielectric material layers 121, 221 may be deposited over the upper surfaces of each of the respective wafers 100, 200. The dielectric material layers 121, 221 may be deposited over the uppermost metal level (e.g., M3) of the interconnect structure of each of the wafers 100, 200, including over the upper surface of the dielectric material 111, 211 and the exposed upper surfaces of the metal lines 115 of the uppermost metal level (M3). Each of the dielectric material layers 121, 221 may include a suitable dielectric material, such as silicon oxide, silicon nitride, etc., and may be deposited using a suitable deposition process as described above.

Referring again to FIGS. 2A and 2B, patterned masks 122, 222 may be formed over an upper surface of the respective dielectric material layers 121, 221 on each of the first wafer 100 and the second wafer 200. Each of the patterned masks 122, 222 may be lithographically patterned to form openings through the masks 122, 222. The openings may correspond to a pattern of via openings that may be subsequently formed through the respective dielectric material layers 121, 221. In some embodiments, the mask 122 formed over the dielectric material layer 121 on the first wafer 100 may have an identical pattern of openings as the pattern of openings through the mask 222 formed over the dielectric material layer 221 on the second wafer 200. Alternatively, the mask 122 formed over the dielectric material layer 121 on the first wafer 100 may have a different pattern of openings than the mask 222 formed over dielectric material layer 221 on the second wafer 200.

Figure 3A:
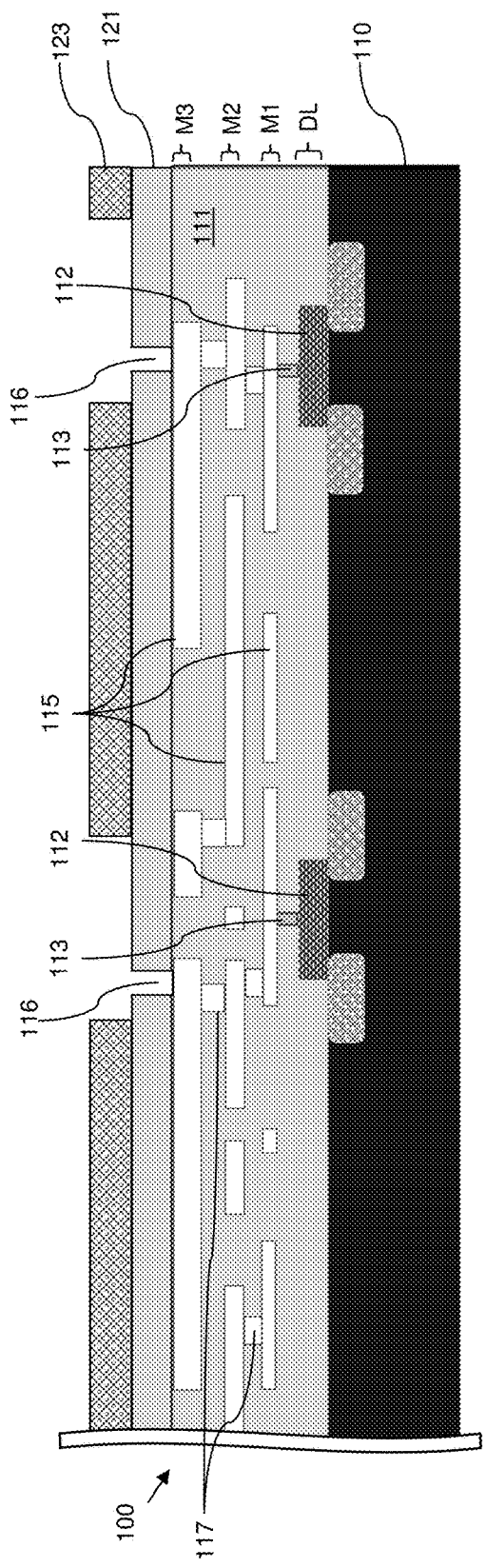
FIG. 3A is a vertical cross-section view of a portion of a first wafer showing via openings formed through a dielectric material layer and a patterned mask deposited over the first dielectric material layer according to an embodiment of the present disclosure.
Figure 3B:
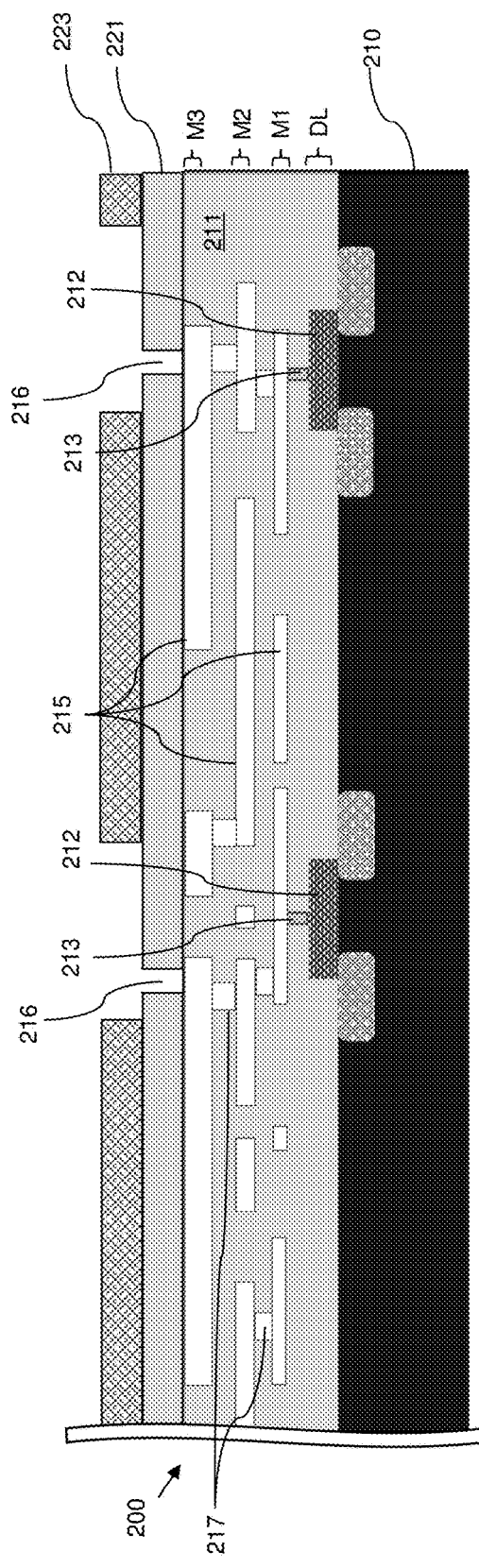
FIG. 3B is a vertical cross-section view of a portion of a second wafer showing via openings formed through a dielectric material layer and a patterned mask deposited over the dielectric material layer according to an embodiment of the present disclosure.

FIG. 3A is a vertical cross-section view of a portion of the first wafer 100 illustrating via structures formed in dielectric material layer 121, and FIG. 3B is a vertical cross-section view of a portion of the second wafer 200 showing via structures 217 formed in dielectric material layer 221. Referring to FIGS. 3A and 3B, an anisotropic etch process may be performed through each of the patterned masks 122, 222 to remove portions of the dielectric material layers 121, 221 and form via openings 116, 216 through the dielectric material layers 121, 221. The via openings 116, 216 may expose a surface of a metal feature (e.g., metal lines 115, 215) in an underlying metal level (e.g., M3). The patterned masks 122, 222 (see FIGS. 2A and 2B) may then be removed via a suitable process, such as by ashing or dissolution by a solvent.

Referring again to FIGS. 3A and 3B, additional patterned masks 123, 223 may be formed over an upper surface of the respective dielectric material layers 121, 221 on each of the first wafer 100 and the second wafer 200. Each of the patterned masks 123, 223 may be lithographically patterned to form openings through the masks 123, 223. The openings may correspond to a pattern of trench openings that may be subsequently formed within the respective dielectric material layers 121, 221. The trench openings may correspond with the locations of metal features that may be subsequently formed in a top metal level (TM) of each of the respective wafers 100, 200. As discussed in further detail below, the top metal level (TM) of at least one of the first wafer 100 and the second wafer 200 may include an array of top metal contact pads. In embodiments, the top metal contact pads may have an array pattern that corresponds to an array pattern of contact pads that are subsequently formed on a bonded wafer device structure that includes the first wafer 100 and the second wafer 200.

In some embodiments, the mask 123 formed over the dielectric material layer 121 on the first wafer 100 may have an identical pattern of openings as the pattern of openings through the mask 223 formed over the dielectric material layer 221 on the second wafer 200. Alternatively, the mask 123 formed over the dielectric material layer 121 on the first wafer 100 may have a different pattern of openings than the mask 223 formed over dielectric material layer 221 on the second wafer 200.

FIG. 4A is a vertical cross-section view of a portion of a first wafer 100 including a plurality of trench openings 126 formed in a dielectric material layer 121, and FIG. 4B is a vertical cross-section view of a portion of a second wafer 200 including a plurality of trench openings 226 formed in a dielectric material layer 221. Referring to FIGS. 4A and 4B, an anisotropic etch process may be performed through each of the patterned masks 123, 223 to remove portions of the dielectric material layers 121, 221 and form trench openings 126, 226 within the dielectric material layers 121, 221. In embodiments, each of the trench openings 126, 226 may be located over one or more via openings 116, 216. The patterned masks 123, 223 may then be removed via a suitable process, such as by ashing or dissolution by a solvent.

FIG. 5A is a vertical cross-section view of a portion of a first wafer 100 including a layer of metal material 125 deposited over the upper surface of dielectric material layer 121 and filling the plurality of trench openings 126 and via openings 116, and FIG. 5B is a vertical cross-section view of a portion of a second wafer 200 including a layer of metal material 225 deposited over the upper surface of dielectric material layer 221 and filling the plurality of trench openings 226 and via openings 216. Referring to FIGS. 5A and 5B, layer 125, 225 of suitable electrically conductive material, such as tungsten (W), copper (Cu), a copper alloy, aluminum (Al), an aluminum alloy, combinations thereof, or the like, may be deposited over the upper surfaces of dielectric material layers 121, 221 and within the trench openings 126, 226 and via openings 116, 216. Other suitable metal materials are within the contemplated scope of disclosure. In some embodiments, a barrier layer (not shown) composed of a suitable barrier material as described above may be first deposited over the upper surfaces of dielectric material layers 121, 221 and within the trench openings 126, 226 and via openings 116, 216, and the layer of metal material 125, 225 may be deposited over the barrier layer. The layer of metal material 125, 225 and the barrier layer, if present, may be deposited using a suitable deposition process, which may include one or more of a chemical vapor deposition (CVD) process, a physical vapor deposition (PVD) process, an atomic layer deposition (ALD) process, an electroplating process, or the like. Other suitable deposition processes are within the contemplated scope of disclosure.

Figure 6A:
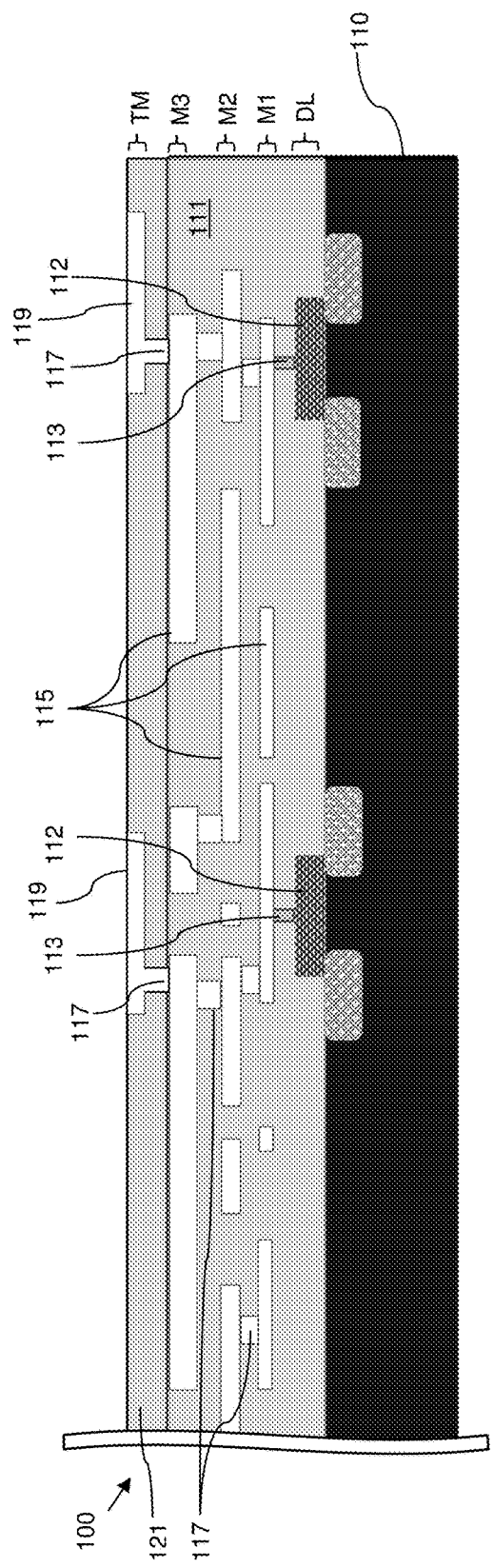
FIG. 6A is a vertical cross-section view of a portion of a first wafer including a plurality of metal features and via structures embedded in a dielectric material layer according to an embodiment of the present disclosure.
Figure 6B:
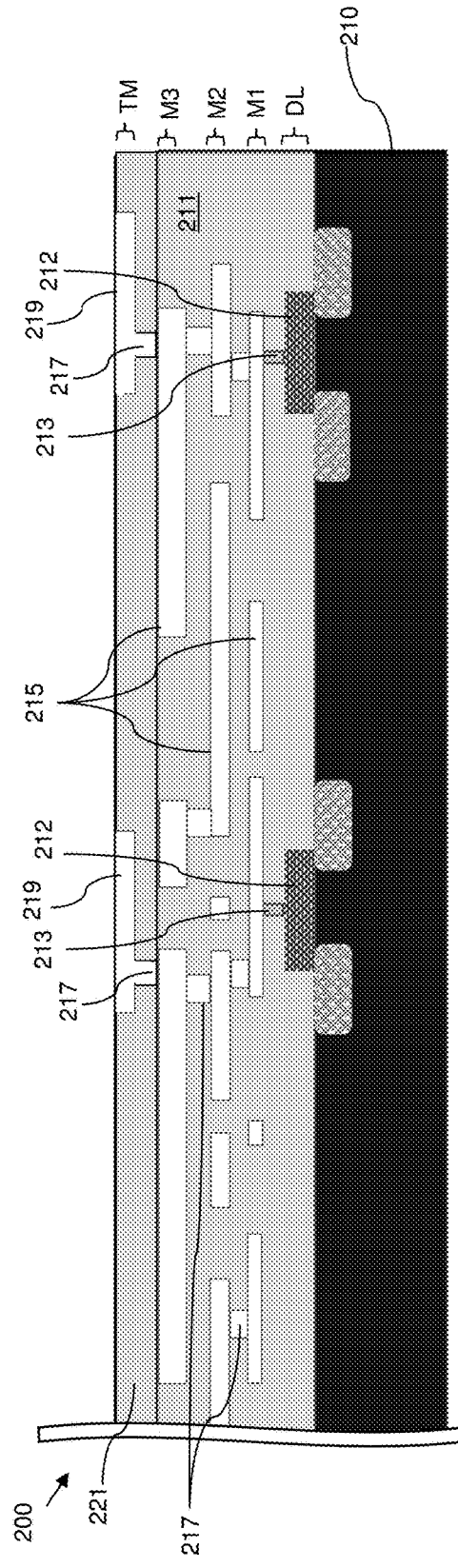
FIG. 6B is a vertical cross-section view of a portion of a second wafer including a plurality of metal features and via structures embedded in a dielectric material layer according to an embodiment of the present disclosure.

FIG. 6A is a vertical cross-section view of a portion of the first wafer 100 showing a plurality of metal features 119 and via structures 117 embedded in dielectric material layer 121, and FIG. 6B is a vertical cross-section view of a portion of the second wafer 200 showing a plurality of metal features 219 and via structures 217 embedded in dielectric material 221. Referring to FIGS. 6A and 6B, each of the first and second wafers 100, 200 may undergo a planarization process, such as a chemical mechanical planarization (CMP) process, to remove the metal material 125, 225 and the barrier material, if present, from above the upper surface of the dielectric material layer 121, 221. The remaining metal material 125, 225 located within the trench openings 126, 226 and the via openings 116, 216 may form metal features 119, 219 and via structures 117, 217 embedded in the respective dielectric material layers 121, 221. The metal features 119, 219 may form a top metal level (TM) of the interconnect structures of each of the first wafer 100 and the second wafer 200. Each of the metal features 119, 219 may have an exposed upper surface and may be connected to a metal feature of an underlying metal level (e.g., M3) by one or more via structures 117, 219.

Figure 7B:
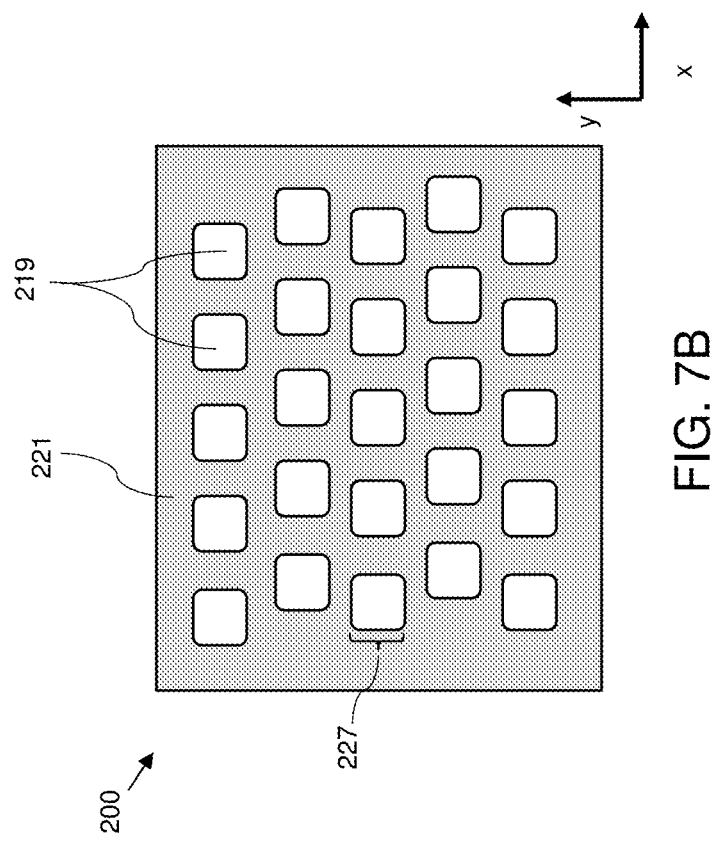
FIG. 7B is a top view of a portion of a top metal layer of a second wafer illustrating an array of metal features embedded in a dielectric material layer according to an embodiment of the present disclosure.
Figure 7A:
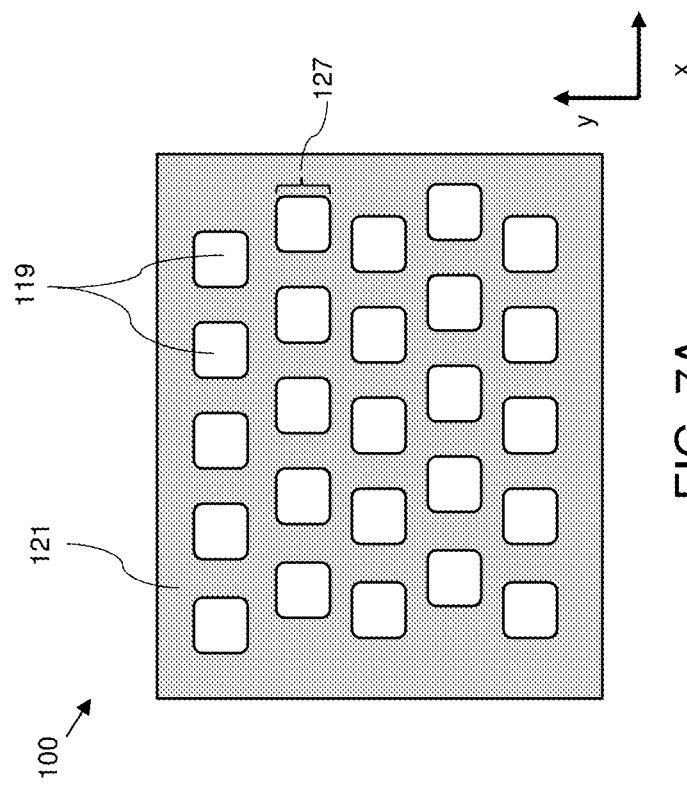
FIG. 7A is a top view of a portion of a top metal layer of a first wafer illustrating an array of metal features embedded in a dielectric material layer according to an embodiment of the present disclosure.

As noted above, the metal features 119, 219 of the top metal level (TM) of at least one of the first wafer 100 and the second wafer 200 may include an array of contact pads that may enable circuit probe testing of the wafers 100, 200 prior to bonding of the wafers 100, 200 to form a bonded wafer structure as described in further detail below. FIGS. 7A and 7B are top views of portions of the first wafer 100 and the second wafer 200, respectively, that schematically illustrate the top metal levels (TM) of each wafer 100, 200 according to an embodiment. As shown in FIGS. 7A and 7B, at least a portion of the metal features 119, 219 of the top metal level (TM) of the wafers 100, 200 are in the form of arrays of contact pads 127, 227. The contact pads 127, 227 may have sufficient size to enable circuit probe testing of the wafer 100, 200. In embodiments, an automated wafer probe system may be used to perform circuit probe testing of the wafer 100, 200. The wafer probe system may align the wafer 100, 200 on the probe system (e.g., using optical pattern recognition), and bring a plurality of contact elements into electrical contact with the contact pads 127, 227 of the wafer 100, 200. In various embodiments, the contact elements may be located on a probe card that is mounted to the wafer probe system. In various embodiments, each of the contact pads 127, 227 may have length and width dimensions (i.e., along the directions of the x- and y-axes in FIGS. 7A and 7B) that are at least about 40 µm, such as between about 40 µm and about 100 µm. The circuit probe testing may include applying electrical signal test patterns to the wafer 100, 200 via the contact pads 127, 227, detecting the electrical response from the wafer 100, 200, and determining whether or not the wafer 100, 200 includes functional defects based on the detected response to the test patterns. Based on the circuit probe test, the wafers 100, 200 may be sorted such that defective wafers are not used to form bonded wafer structures.

In various embodiments, at least some wafers may be formed having top metal contact pads that include an array pattern that corresponds to an array pattern of contact pads that are subsequently formed on a bonded wafer device structure that includes multiple stacked and bonded wafers. This may enable the same circuit probe testing equipment (e.g., a probe card) that may be used to test the assembled bonded wafer device to also be used to identify defective or otherwise non-conforming wafers at an earlier stage of the fabrication process. FIG. 8A is a top view of a portion of a bonded wafer structure 300 schematically illustrating an array of contact pads 19 of the bonded wafer structure 300, and FIG. 8B is a top view of a portion of a top metal level TM of the second wafer 200 schematically illustrating an array of top metal contact pads 227 according to an embodiment of the present disclosure. Referring to FIGS. 8A and 8B, the array pattern of the contact pads 19 of the bonded wafer structure 300 may correspond to the array pattern of the top metal contact pads 227 of the second wafer 200. In various embodiments, the array pattern of the contact pads 19 of the bonded wafer structure 300 may be considered to correspond to the array pattern of the top metal contact pads 227 of a wafer 200 when the spatial coordinates of a geometric center point, C, of each contact pad 19 of an array of contact pads of the bonded wafer structure 300 (e.g., contact pads 19-1 through 19-8 in FIG. 8A) coincide with the spatial coordinates of a geometric center point, C, of a top metal contact pad 227 of an array of top metal contact pads 227 of the wafer 200 (e.g., contact pads 227-1 through 227-8 in FIG. 8B). The spatial coordinates of the respective center points, C, may be with respect to a common frame of reference. In the embodiment schematically illustrated in FIGS. 8A and 8B, for example, the spatial coordinates are with respect to an origin point, $O_{(x,y)}$ that is located in the top left corner in both the depicted portion of the bonded wafer structure 300, and the depicted portion of the wafer 200, when both are observed from above. As used herein, the geometric center points of two contact pads may be considered to coincide with one another when the difference in their spatial coordinates does not exceed 5 μm along the x-axis or the y-axis within the common frame of reference.

In various embodiments, the top metal contact pads 227 of the wafer 200 may have the same size and shape as the corresponding contact pads 19 of the bonded wafer structure 300, or at least some of the top metal contact pads 227 of the wafer 200 may have a different size and/or shape than the corresponding contact pads 19 of the bonded wafer structure 300. As shown in FIGS. 8A and 8B, for example, top metal contact pad 227-4 has the same size and shape as the corresponding contact pad 19-4 of the bonded wafer structure 300 within the horizontal x-y plane. Top metal contact pad 227-8 has a different size than the corresponding contact pad 19-8 of the bonded wafer structure 300. In particular, top metal contact pad 227-8 has a smaller length dimension, $L_2$, than the length dimension, $L_1$, of contact pad 19-8. In various embodiments, the length dimensions, L, within the horizontal x-y plane of each of the top metal contact pads 227 of the wafer 200 may be at least about 40 μm, such as between about 40 μm and about 100 μm.

Figure 8C:
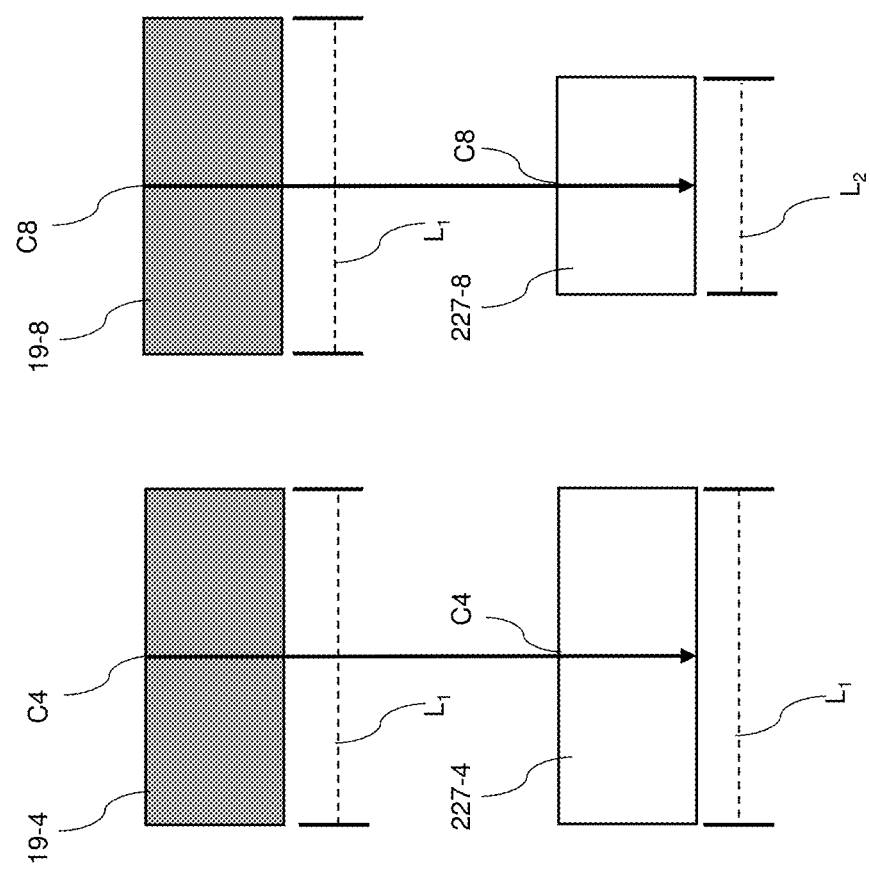
FIG. 8C illustrates vertical cross-section views of contact pads of a bonded wafer structure and top metal contact pads of a wafer of the bonded wafer structure according to an embodiment of the present disclosure.

FIG. 8C illustrates vertical cross-section views of contact pads 19-4, 19-8 of the bonded wafer structure 300 and top metal contact pads 227-4, 227-9 of the second wafer 200. Referring to FIGS. 8A-8C, the geometric center points, C4 and C8, of the corresponding pairs of contact pads 19-4, 19-8 and top metal contact pads 227-4, 227-8, may coincide (±5 μm), regardless of whether the contact pads 19-4, 19-8 and top metal contact pads 227-4, 227-8 have the same size and shape. Further, although the contact pads 19-4, 19-8 and top metal contact pads 227-4, 227-8 shown in this embodiment have the same thicknesses, it will be understood that the thicknesses of the pads 19-4, 19-8 and top metal contact pads 227-4, 227-8 may be different.

Referring again to FIG. 8B, the top metal contact pads 227 may include solid contact pads with no internal openings therethrough, as shown by contact pads 227-2 through 227-8. Alternatively, at least a portion of the top metal contact pads 227 may be slotted contact pads having openings through the pads, such as shown by top metal contact pad 227-1. In various embodiments, a slotted contact pad design as shown by contact pad 227-1 may reduce stress on the contact pad and surrounding features of the wafer.

Figure 9:
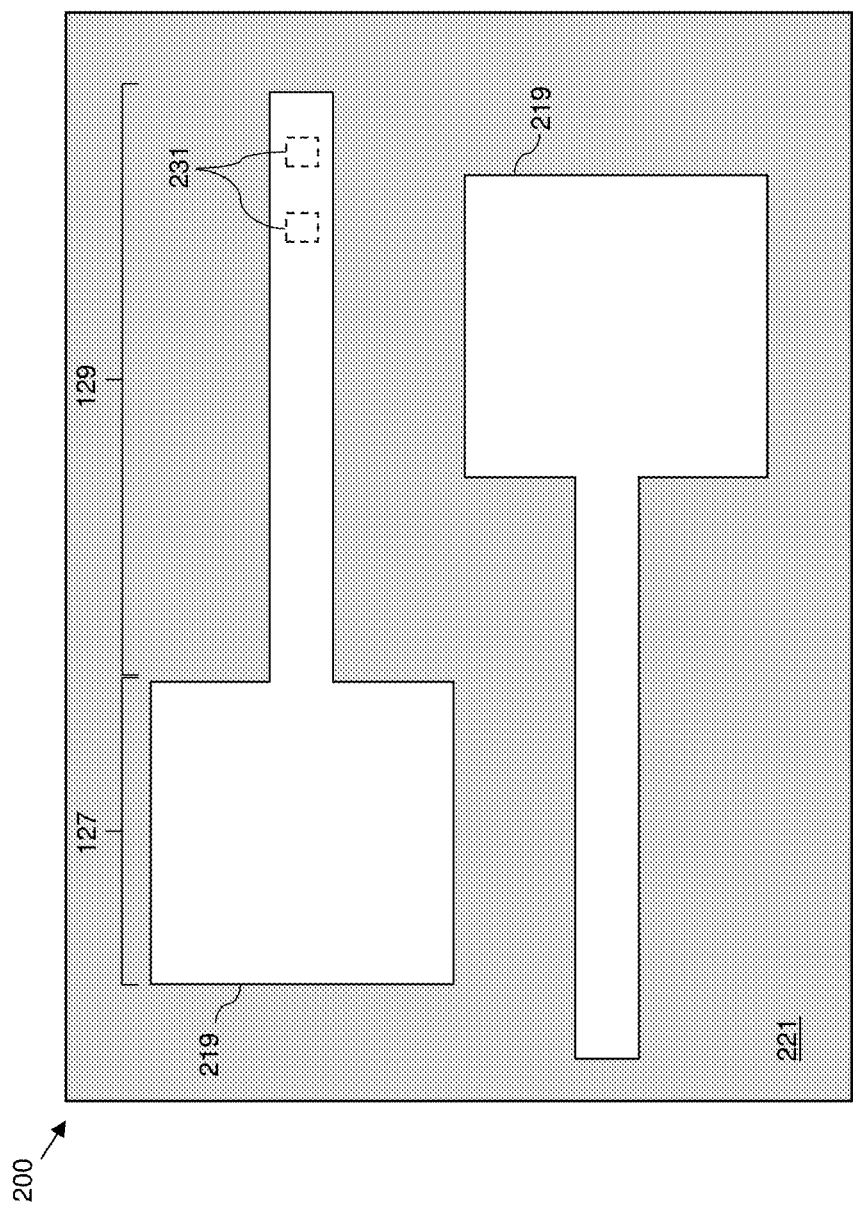
FIG. 9 is a top view of a portion of a wafer illustrating top metal features having contact pad regions according to an embodiment of the present disclosure.

FIG. 9 is a top view of a portion of the second wafer 200 illustrating top metal features 219 having contact pad regions 127 according to an embodiment of the present disclosure. Referring to FIG. 9, in various embodiments, the top metal features 119, 219 of the top metal level (TM) of the wafers 100, 200 may include a contact pad region 127 and one or more second regions 129. The contact pad region 127 and the one or more second regions 129 may be contiguous, non-overlapping portions of the top metal feature 219, and may be laterally surrounded by dielectric material 121 as shown in FIG. 9. The contact pad region 127 of the top metal feature 219 may have length and width dimensions that enable circuit probe testing of the top metal feature 219. In embodiments, the length and width dimensions of the contact pad region 127 may be at least about 40 μm, such as between 40 μm and 100 μm. In general, the dimensions of the contact pad regions 127 may be sufficiently large to enable effective electrical contact between the contact pad regions 127 and the contact element (e.g., probe mark) of the wafer probe system. In embodiments, the dimensions of the contact pad regions 127 may not be large enough to induce an antenna effect which can result in damage to the devices on the wafer 100, 200. The length and width dimensions of the one or more second regions 129 may be different than the dimensions of the contact pad region 127. For example, the one or more second regions 129 may have at least one dimension that is less than about 40 μm, and may optionally have at least one dimension that is greater than about 100 μm. In the embodiment shown in FIG. 9, each metal feature 219 of the top metal level (TM) includes a contact pad region 127 and an elongate second region 129 that may resemble a conventional metal line.

In various embodiments, a top metal feature 219 including a contact pad region 127 and one or more second regions 129 as shown in FIG. 9 may be used to route electrical signals from lower level(s) of the interconnect structure (e.g., M1-M3) to a bonding layer that may be subsequently formed over the top metal level (TM) of the wafer 200, and ultimately to an adjacent wafer (e.g., first wafer 100) in the bonded wafer structure. Since circuit probe testing in the contact pad region 127 of the metal feature 219 may result in a modification of the topology of the conductive material in the contact pad region 127, in various embodiments, the electrical connection between the metal feature 219 and the subsequently-formed bonding level may be made in the one or more second regions 129. This may help to ensure that an effective electrical connection is made. FIG. 9 schematically illustrates contact areas 231 in the second region 129 of the top metal feature 219. In embodiments, the contact areas 231 may be the locations where electrically conductive material (e.g., hybrid bond link material) may be subsequently formed to electrically connect the top metal feature 219 to an upper level of the wafer 200, such as a bonding layer (BL) as described in further detail below.

FIGS. 10A-15 are sequential side cross-section views illustrating a process of forming bonding layers (BL) on each of the first and second wafers 100, 200, and bonding the first and second wafers 100, 200 to form a bonded wafer structure 300. Referring to FIGS. 10A and 10B, dielectric material layers 133, 233 may be deposited over the upper surfaces of each of the wafers 100, 200. The dielectric material layers 133, 233 may be deposited over the top metal level (TM) of the interconnect structure of each of the wafers 100, 200, including over the upper surface of the dielectric material layers 121, 221 and the exposed upper surfaces of the metal features 119, 219 of the top metal level (TM). Each of the dielectric material layers 133, 233 may include a suitable dielectric material, such as silicon oxide, silicon nitride, etc., and may be deposited using a suitable deposition process as described above. In various embodiments, the dielectric material layers 133, 233 may include silicon oxynitride ($SiO_xN_y$). Other suitable dielectric materials may be within the contemplated scope of disclosure.

Referring again to FIGS. 10A and 10B, patterned masks 137, 237 may be formed over an upper surface of the respective dielectric material layers 133, 233 on each of the first wafer 100 and the second wafer 200. Each of the patterned masks 137, 237 may be lithographically patterned to form openings through the masks 137, 237. The openings may correspond to a pattern of openings that may be subsequently formed through the respective dielectric material layers 133, 233. In various embodiments, the openings through the masks 137, 237 may correspond to the locations of metal features 119, 219 in the top metal level (TM) of the first and second wafers 100, 200.

Figure 11A:
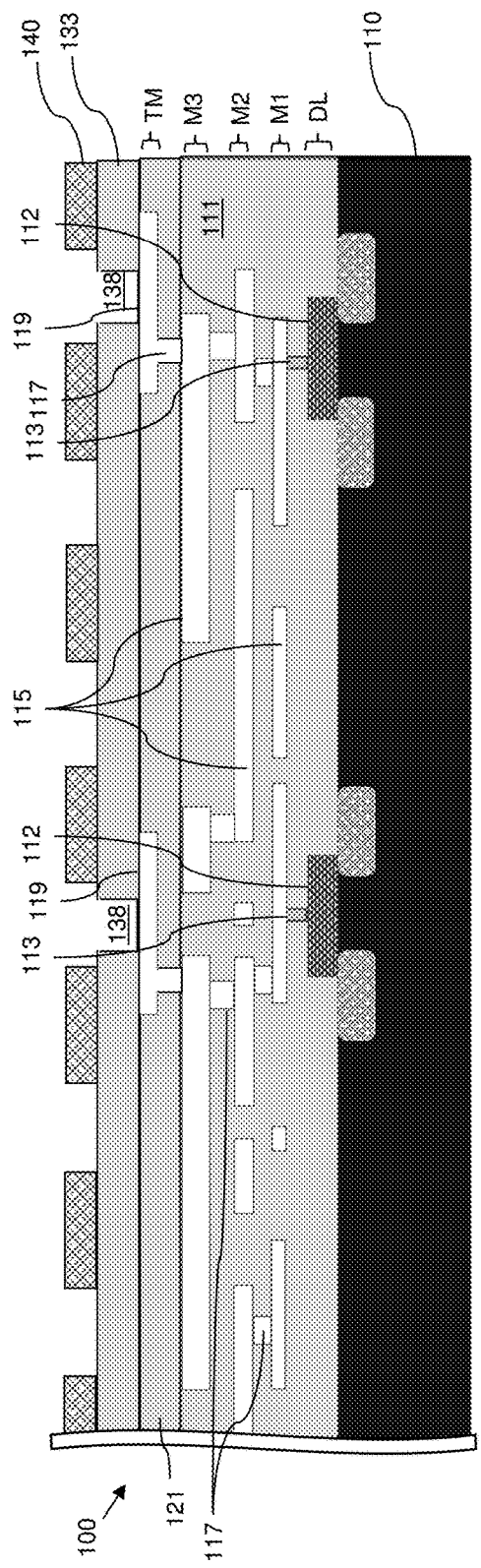
FIG. 11A is a vertical cross-section view of a portion of a first wafer including openings formed through a dielectric material layer to expose portions of a top metal layer according to an embodiment of the present disclosure.
Figure 11B:
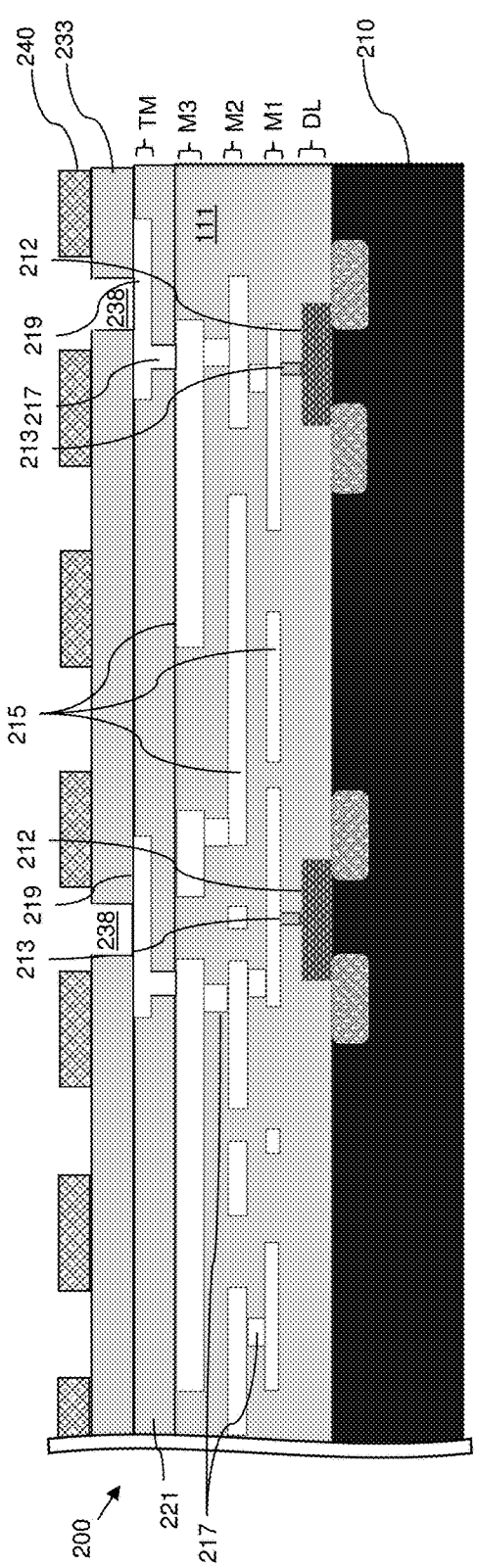
FIG. 11B is a vertical cross-section view of a portion of a second wafer including openings formed through a dielectric material layer to expose portions of a top metal layer according to an embodiment of the present disclosure.

FIG. 11A is a vertical cross-section view of a portion of the first wafer 100 including openings 138 formed through the dielectric material layer 133 to expose portions of the top metal level TM, and FIG. 11B is a vertical cross-section view of a portion of the second wafer 200 including openings 238 formed through the dielectric material layer 233 to expose portions of the top metal level TM. Referring to FIGS. 11A and 11B, an anisotropic etch process may be performed through each of the patterned masks 137, 237 to remove portions of the dielectric material layers 133, 233 and form openings 138, 238 through the dielectric material layers 133, 233. The openings 138, 238 may expose a surface of a metal feature 119, 219 in the underlying top metal level TM. The patterned masks 137, 237 (see FIGS. 10A and 10B) may then be removed via a suitable process, such as by ashing or dissolution by a solvent.

Referring again to FIGS. 11A and 11B, additional patterned masks 140, 240 may be formed over an upper surface of the respective dielectric material layers 133, 233 on each of the first wafer 100 and the second wafer 100. Each of the patterned masks 140, 240 may be lithographically patterned to form openings through the masks 140, 240. The openings may correspond to a pattern of trench openings that may be subsequently formed within the respective dielectric material layers 133, 233. The trench openings may subsequently be filled with a bonding material that may be used to bond the first wafer 100 and the second wafer 200 to form a bonded wafer structure 300.

Figure 12A:
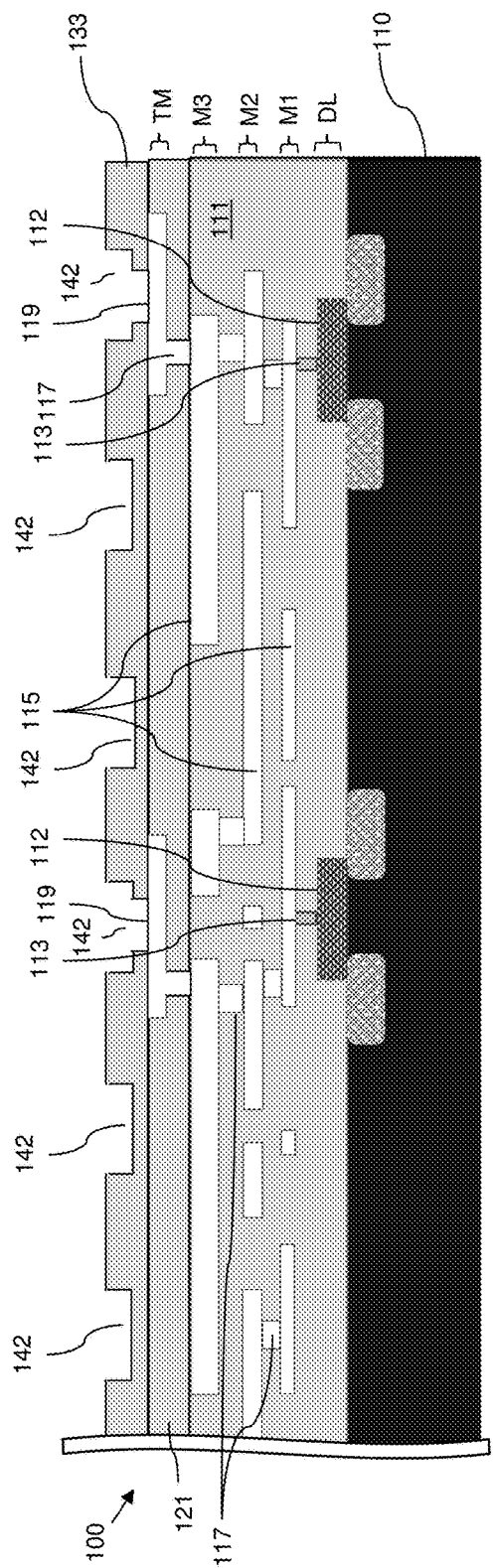
FIG. 12A is a vertical cross-section view of a portion of a first wafer including trenches formed in a dielectric material layer according to an embodiment of the present disclosure.
Figure 12B:
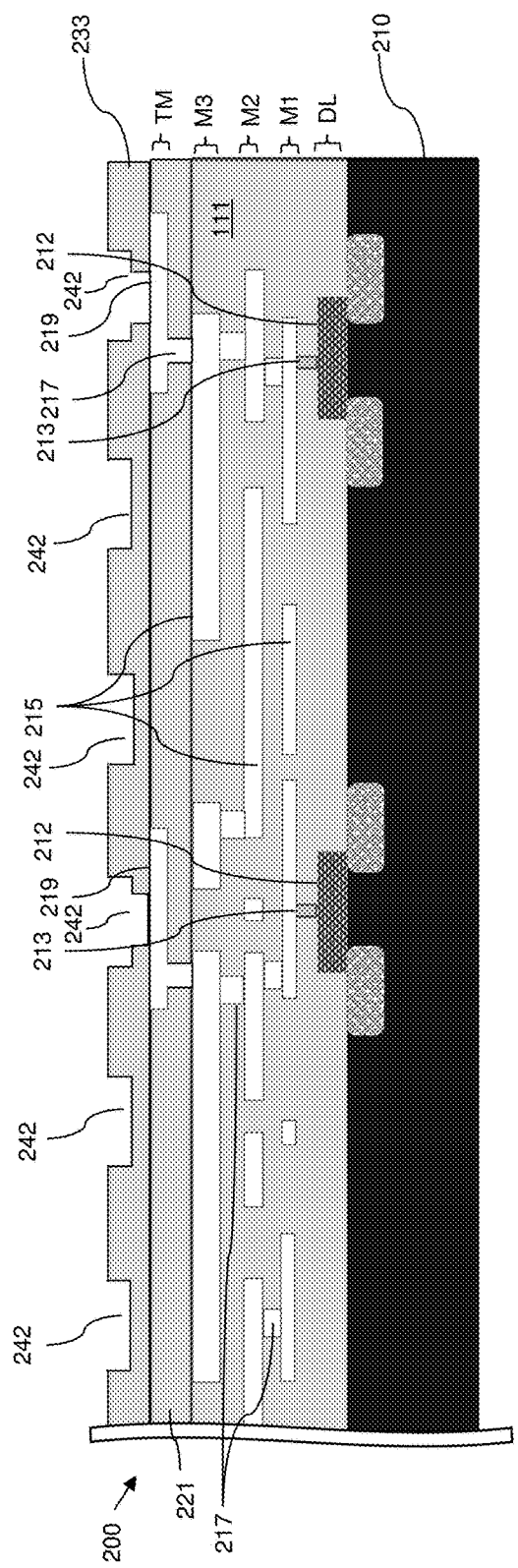
FIG. 12B is a vertical cross-section view of a portion of a second wafer including trenches formed in a dielectric material layer according to an embodiment of the present disclosure.

FIG. 12A is a vertical cross-section view of a portion of a first wafer 100 including a plurality of trench openings 142 formed in dielectric material layer 133, and FIG. 12B is a vertical cross-section view of a portion of a second wafer 200 including a plurality of trench openings 242 formed in dielectric material layer 233. Referring to FIGS. 12A and 12B, an anisotropic etch process may be performed through each of the patterned masks 140, 240 to remove portions of the dielectric material layers 133, 233 and form trench openings 142, 242 within the dielectric material layers 121, 221. In embodiments, at least some of the trench openings 142, 242 may be located over one or more openings 138, 238. The patterned masks 140, 240 may then be removed via a suitable process, such as by ashing or dissolution by a solvent.

Figure 13A:
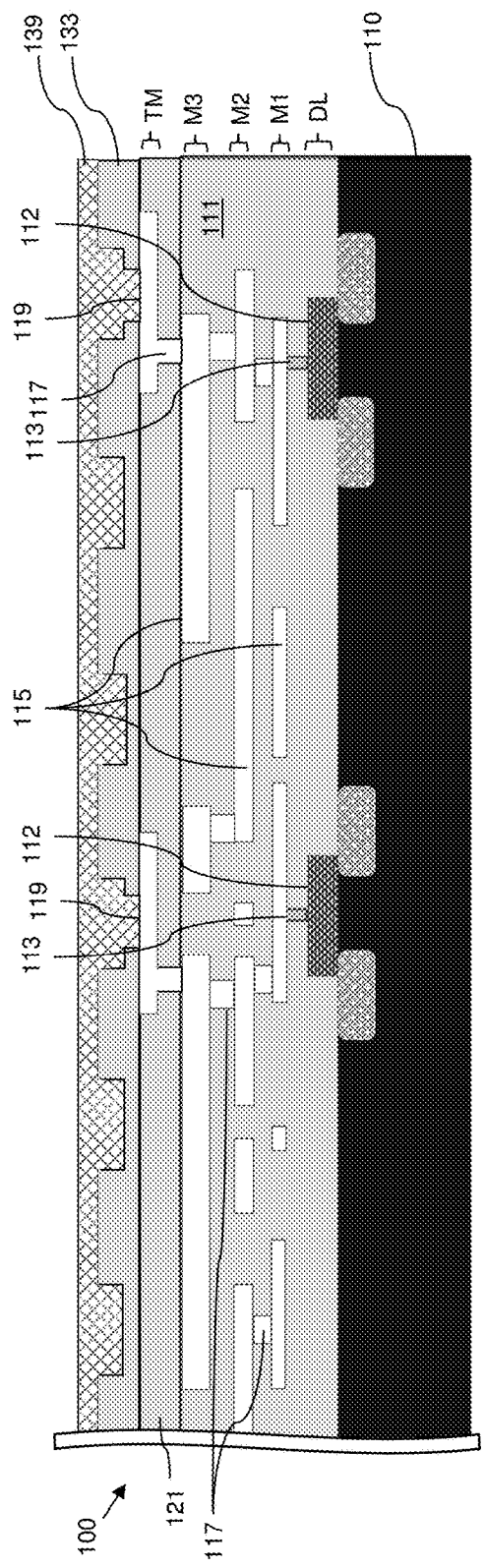
FIG. 13A is a vertical cross-section view of a portion of a first wafer including a layer of bonding material deposited over a dielectric material layer and filling a plurality of trenches and openings in the dielectric material layer according to an embodiment of the present disclosure.
Figure 13B:
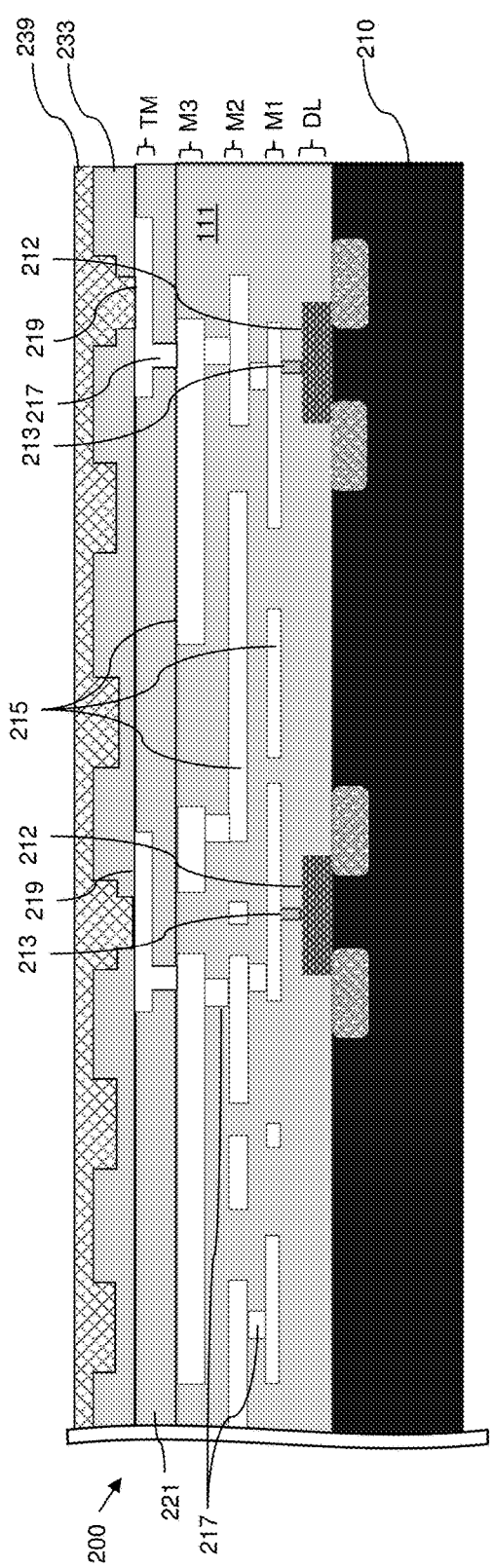
FIG. 13B is a vertical cross-section view of a portion of a second wafer including a layer of bonding material deposited over a dielectric material layer and filling a plurality of trenches and openings in the dielectric material layer according to an embodiment of the present disclosure.

FIG. 13A is a vertical cross-section view of a portion of the first wafer 100 including a layer of bonding material 139 deposited over the upper surface of dielectric material layer 133 and filling the plurality of trench openings 142 and openings 138, and FIG. 13B is a vertical cross-section view of a portion of the second wafer 200 including a layer of bonding material 239 deposited over the upper surface of dielectric material layer 233 and filling the plurality of trench openings 242 and openings 238. Referring to FIGS. 13A and 13B, the layer of bonding material 139, 239 may include an electrically conductive material that may function as a bonding medium to mechanically bond the first wafer 100 to the second wafer 200 and may also enable electrical signals to be routed between the first wafer 100 and the second wafer 200. In various embodiments, the layer of bonding material 139, 239 may be a metal material, such as copper, a copper alloy, tungsten (W), aluminum (Al), an aluminum alloy, combinations thereof, or the like. Other suitable bonding materials are within the contemplated scope of disclosure. In some embodiments, a barrier layer (not shown) composed of a suitable barrier material as described above may be first deposited over the upper surfaces of dielectric material layers 133, 233 and within the trench openings 142, 242 and openings 138, 238, and the layer of bonding material 139, 239 may be deposited over the barrier layer. The layer of bonding material 139, 239 and the barrier layer, if present, may be deposited using a suitable deposition process, which may include one or more of a chemical vapor deposition (CVD) process, a physical vapor deposition (PVD) process, an atomic layer deposition (ALD) process, an electroplating process, or the like. Other suitable deposition processes are within the contemplated scope of disclosure.

Figure 14A:
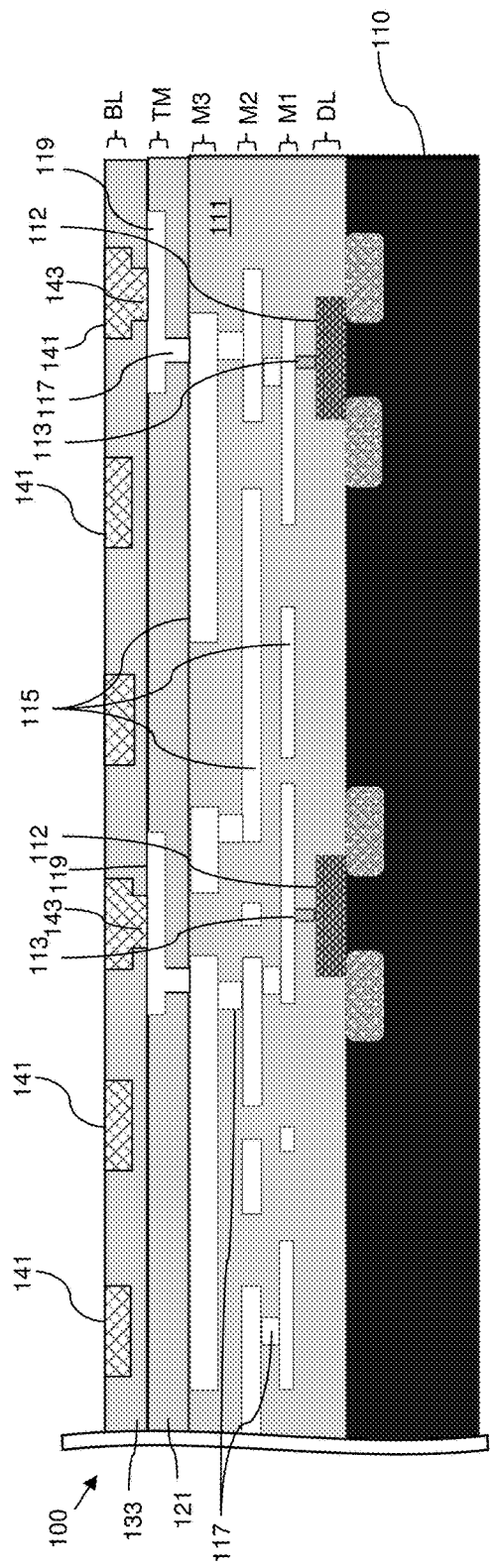
FIG. 14A is a vertical cross-section view of a portion of a first wafer including a plurality of bonding pads and bonding link portions embedded within a dielectric material layer according to an embodiment of the present disclosure.
Figure 14B:
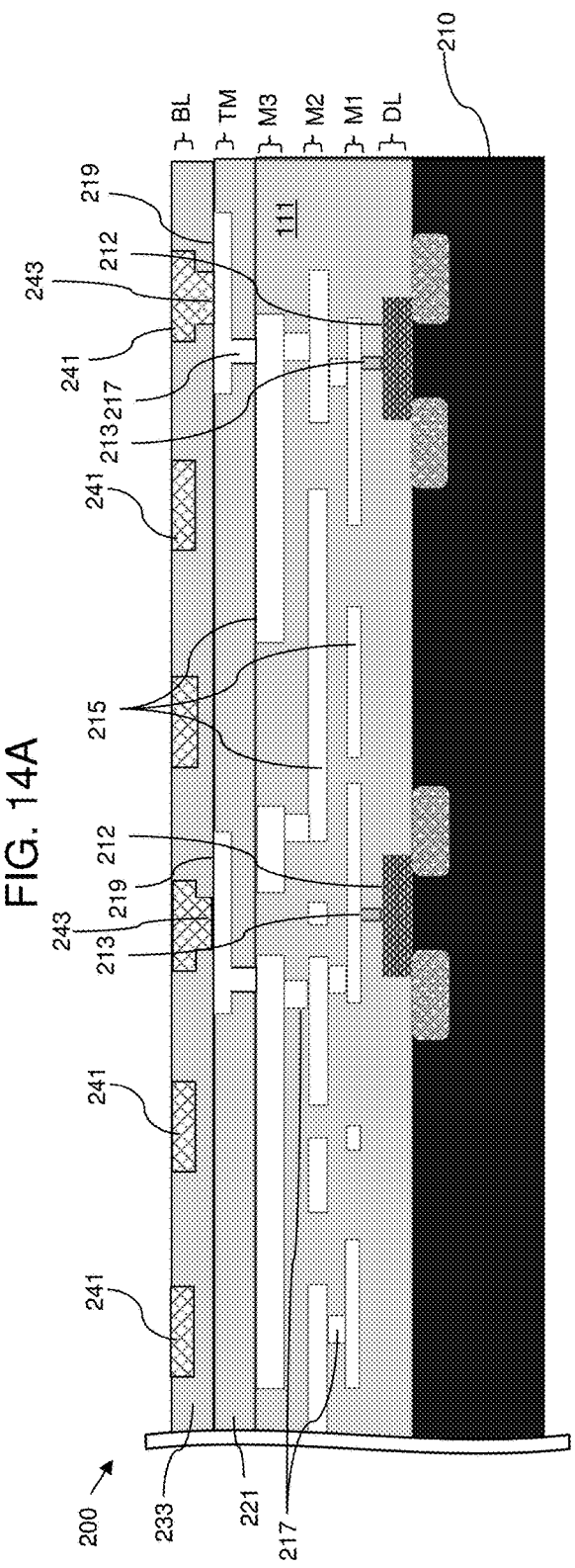
FIG. 14B is a vertical cross-section view of a portion of a second wafer including a plurality of bonding pads and bonding link portions embedded within a dielectric material layer according to an embodiment of the present disclosure.

FIG. 14A is a vertical cross-section view of a portion of the first wafer 100 including a plurality of bonding pads 141 and bonding link portions 143 embedded within dielectric material layer 133, and FIG. 14B is a vertical cross-section view of a portion of the second wafer 200 including a plurality of bonding pads 241 and bonding link portions 243 embedded within dielectric material layer 233 according to an embodiment of the present disclosure. Referring to FIGS. 14A and 14B, each of the first and second wafers 100, 200 may undergo a planarization process, such as a chemical mechanical planarization (CMP) process, to remove the layer of bonding material 139, 239 and the barrier material, if present, from above the upper surface of the dielectric material layer 133, 233. The remaining portions of the bonding material 139, 239 located within the trench openings 142, 242 and the openings 138, 238 may form bonding pads 141, 241 and bonding link portions 143, 243 embedded in the respective dielectric material layers 133, 233. The bonding pads 141, 241 may form a bonding layer (BL) on each of the first wafer 100 and the second wafer 200. Each of the bonding pads 141, 241 may have an exposed upper surface and may be laterally surrounded by the respective dielectric material layers 133, 233. At least a portion of the bonding pads 141, 241 may be connected to a metal feature 119, 219 of the underlying top metal level TM by one or more bonding link portions 143, 243.

Figure 15:
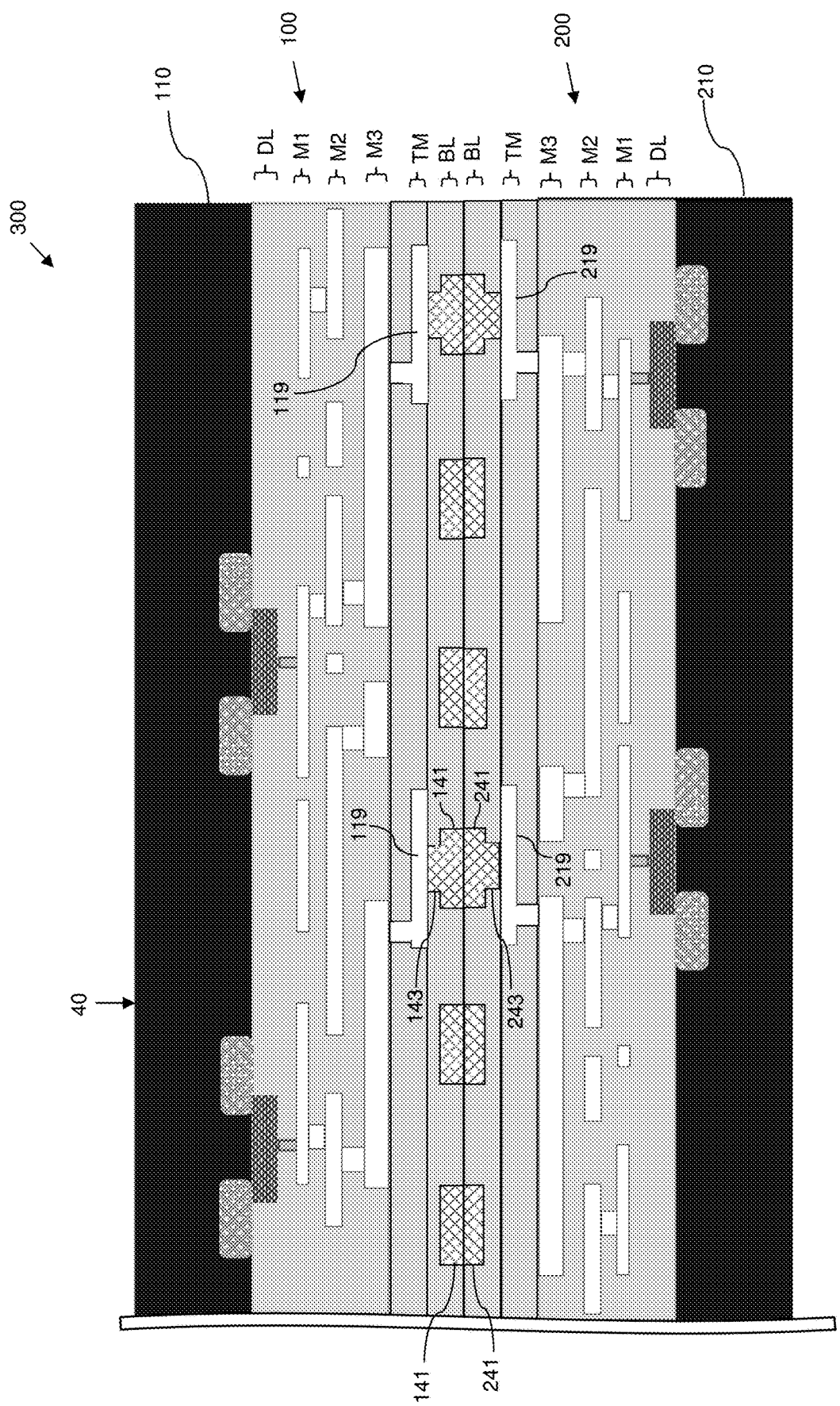
FIG. 15 is a vertical cross-section view of a bonded wafer structure including a first wafer bonded to a second wafer according to an embodiment of the present disclosure.

FIG. 15 is a vertical cross-section view of a bonded wafer structure 300 including the first wafer 100 bonded to the second wafer 200 according to an embodiment of the present disclosure. In various embodiments, the first wafer 100 may be bonded to the second wafer 200 using a hybrid bonding technique. Referring to FIG. 15, in various embodiments, the surfaces of the first and second wafers 100, 200 may optionally be pre-treated to promote surface activation (e.g., using a plasma treatment process). The first wafer 100 may be flipped (e.g., inverted) and stacked onto the second wafer 200 so that the bonding layer (BL) of the first wafer 100 faces the bonding layer (BL) of the second wafer 200. The first wafer 100 and the second wafer 200 may be aligned such that the bonding pads 141 of the first wafer 100 contact corresponding bonding pads 241 of the second wafer 200. The stack of wafers 100, 200 may then be annealed at an elevated temperature. The bonding process may result in a diffusion bond forming between the bonding pads 141 of the first wafer 100 and the corresponding bonding pads 241 of the second wafer 200.

Figure 16:
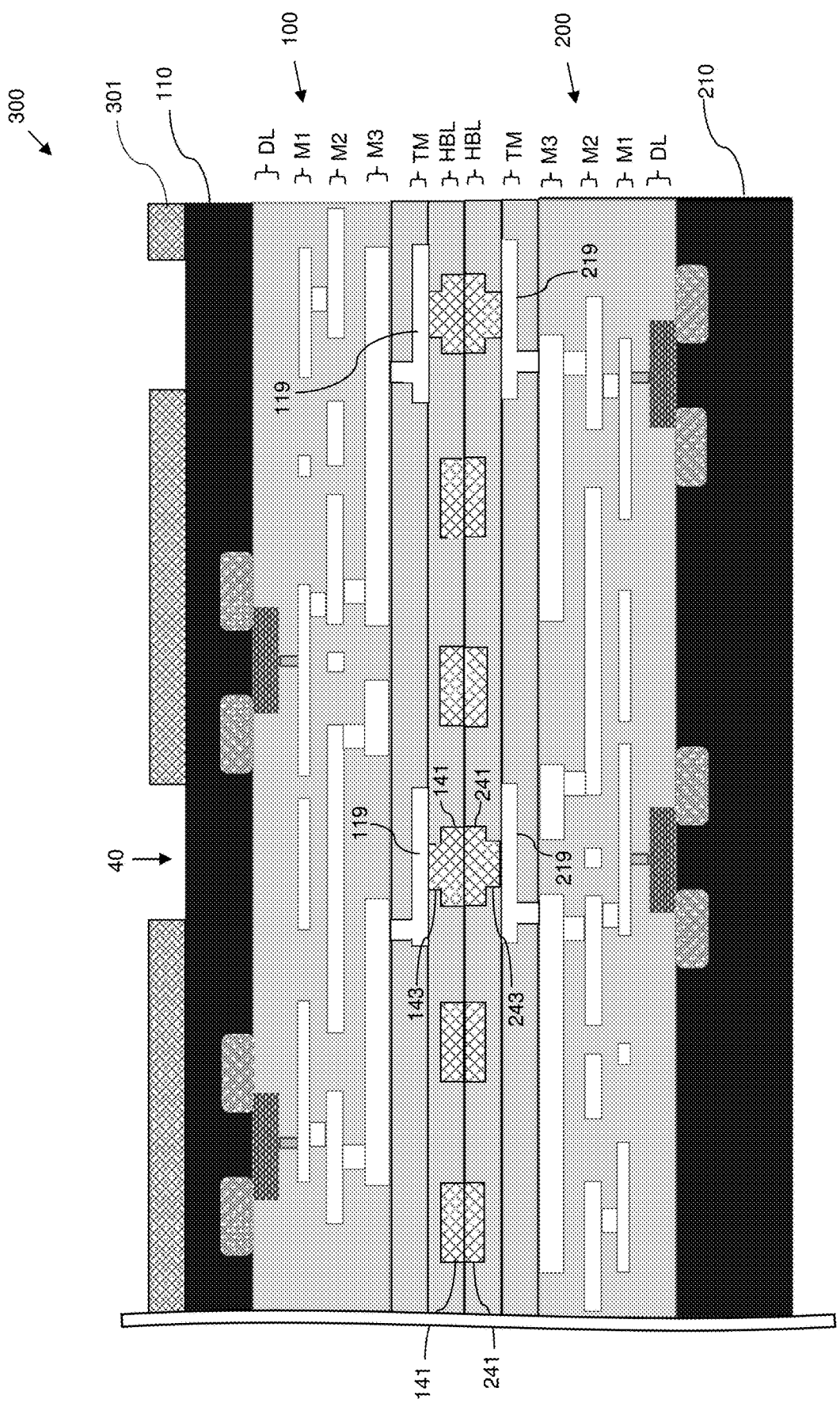
FIG. 16 is a vertical cross-section view of a bonded wafer structure including a patterned mask formed over a backside of a substrate of a first wafer according to an embodiment of the present disclosure.

FIGS. 16-29 are sequential side cross-section views illustrating a process of forming an array of contact pads 19 on a bonded wafer structure 300 according to an embodiment of the present disclosure. Referring to FIG. 16, the back side 40 of the first substrate 110 of the first wafer 100 may optionally be thinned using a suitable process, such as mechanical grinding, chemical mechanical planarization (CMP), or by an etching process. A patterned mask 301 may be formed over the back side 40 of the first substrate 100. The patterned mask 301 may be lithographically patterned to form openings through the mask 301. The openings may correspond to a pattern of through-substrate via openings that may be subsequently formed through the first substrate 110.

Figure 17:
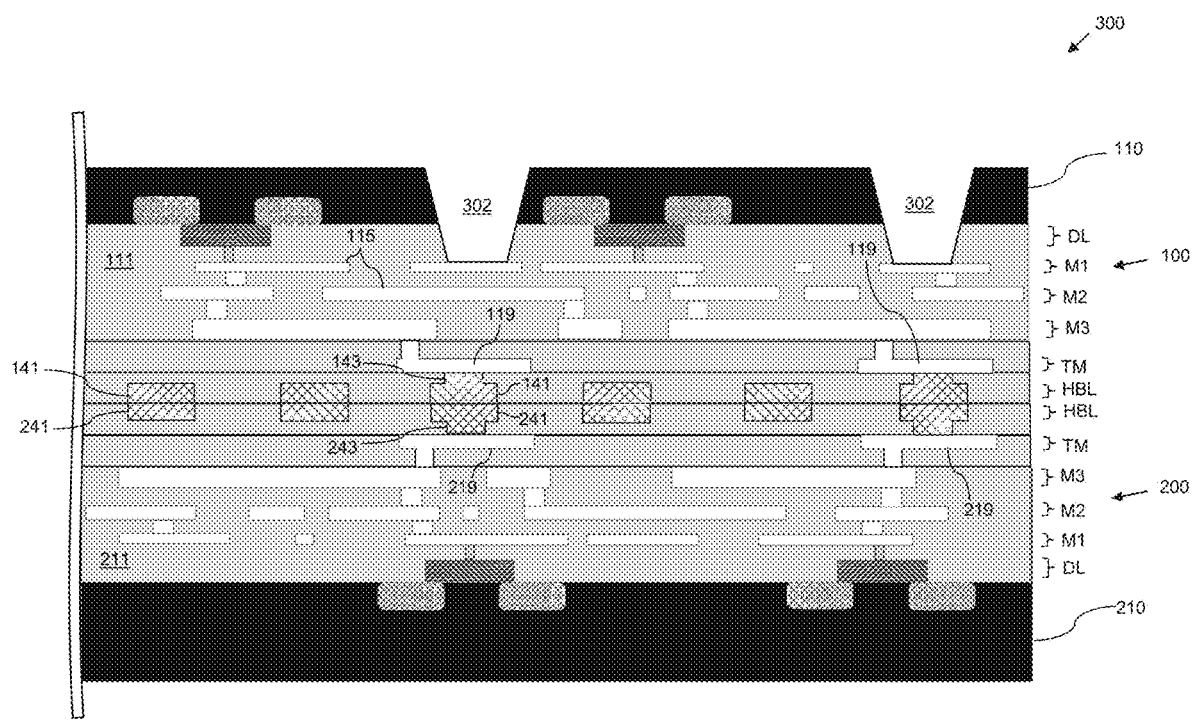
FIG. 17 is a vertical cross-section view of a bonded wafer structure including a plurality of openings formed through a substrate and a dielectric material of a first wafer to expose metal features of an interconnect structure according to an embodiment of the present disclosure.

FIG. 17 is a vertical cross-section view of the bonded wafer structure 300 including a plurality of via openings 302 formed through the first substrate 110 and the dielectric material 111 of the first wafer 100 to expose portions of a metal feature 115 according to an embodiment of the present disclosure. Referring to FIG. 17, an anisotropic etch process may be performed through the patterned mask 301 to remove portions of the first substrate 110 and dielectric material 111 of the first wafer 100 and form via openings 302 through the back side of the first wafer 100. Each of the via openings 302 may expose a surface of a metal feature, such as metal lines 115 of the interconnect structure of the first wafer 100. Following the etching process, the patterned mask 301 may be removed via a suitable process, such as by ashing or dissolution by a solvent.

Figure 18:
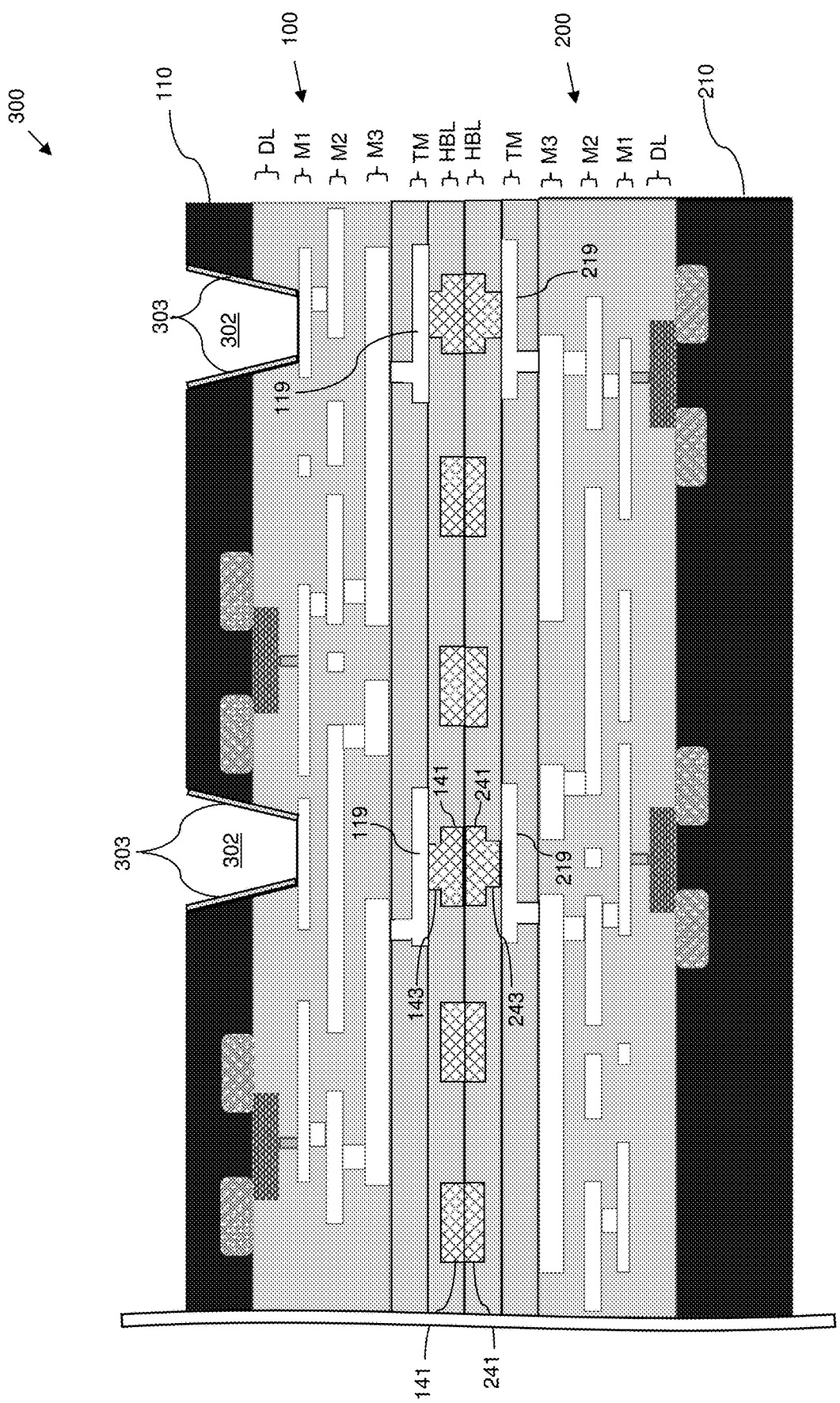
FIG. 18 is a vertical cross-section view of a bonded wafer structure including a layer of liner material on the sidewalls of a plurality of openings formed through a substrate and a dielectric material of a first wafer according to an embodiment of the present disclosure.

FIG. 18 is a vertical cross-section view of the bonded wafer structure 300 including a layer of liner material 303 on the sidewalls of a plurality of openings 302 formed through the first substrate 110 and the dielectric material 111 of the first wafer 100 according to an embodiment of the present disclosure. Referring to FIG. 18, a layer of liner material 303 may be conformally deposited over the back side 40 of the first substrate 110 and along the side walls and the bottom surface of each of the openings 302. In embodiments, an anisotropic etch process may remove horizontally-extending portions of the layer of liner material 303 while leaving the layers of liner material 303 on the side walls of the openings 302. The liner material 303 may include a suitable dielectric material, such as an oxide material (e.g., $SiO_2$) that may be deposited using a suitable deposition process. Other suitable dielectric materials for the layer of liner material 303 are within the contemplated scope of disclosure. The layer of liner material 303 may help to maintain a voltage bias between the through-substrate via structure that is subsequently formed within the openings and the surrounding semiconductor material of the substrate 110.

Figure 19:
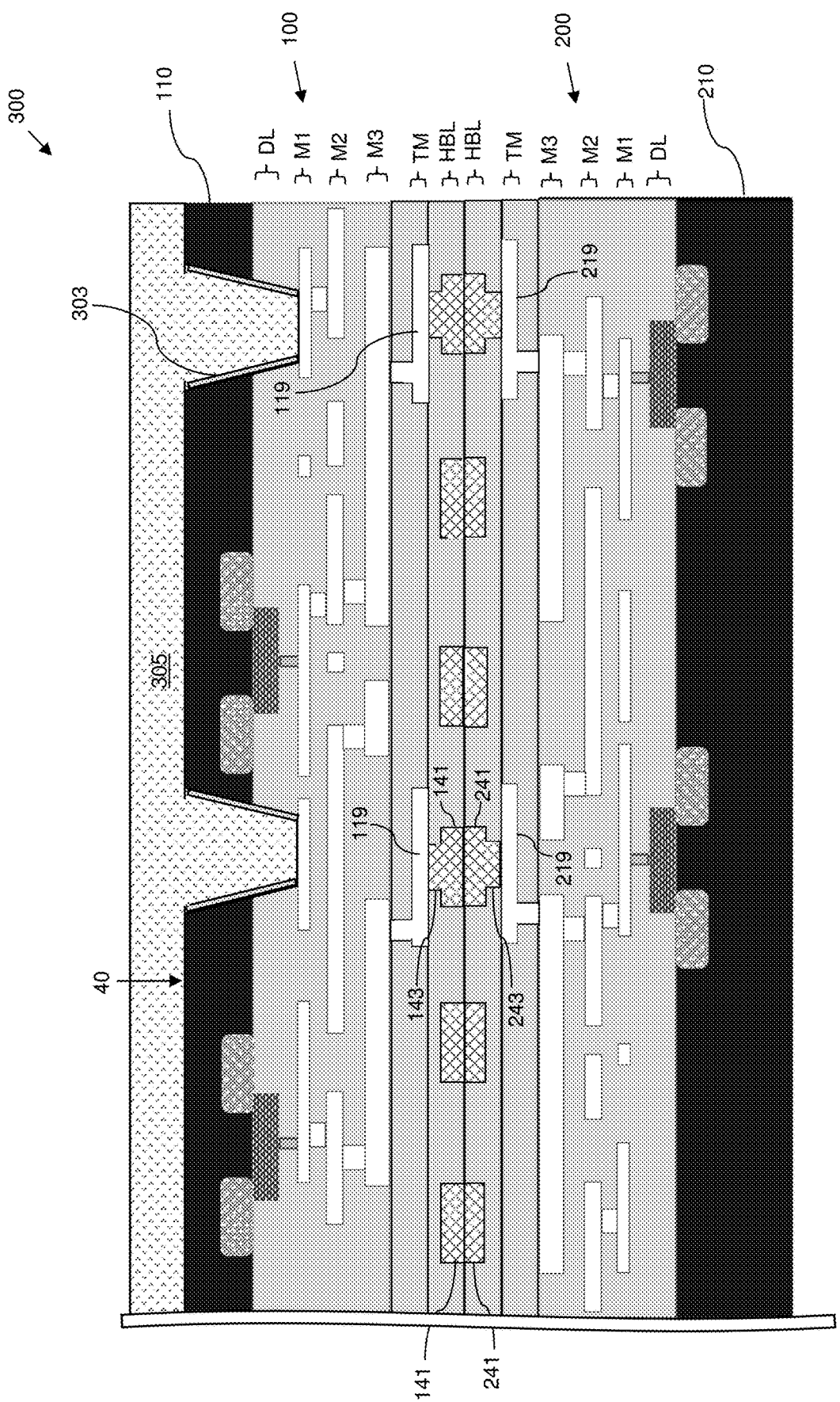
FIG. 19 is a vertical cross-section view of a bonded wafer structure including a layer of electrically conductive material deposited over a backside of a substrate of a first wafer and within a plurality of openings in the first wafer according to an embodiment of the present disclosure.

FIG. 19 is a vertical cross-section view of the bonded wafer structure 300 including a layer of electrically conductive material 305 deposited over the back side 40 of the first substrate 110 of the first wafer 100 and within the plurality of openings 302 in the first wafer 100 according to an embodiment of the present disclosure. Referring to FIG. 19, the layer of electrically conductive material 305 may include a metal material, such as copper (Cu), a copper alloy, aluminum (Al), an aluminum alloy, tungsten (W), combinations thereof, or the like, that may be deposited over the back side 40 of the first substrate 110 of the first wafer 100 and within the openings 302 in the first wafer 100. Other suitable electrically conductive materials are within the contemplated scope of disclosure. The layer of electrically conductive 305 material may be deposited using a suitable deposition process, which may include one or more of a chemical vapor deposition (CVD) process, a physical vapor deposition (PVD) process, an atomic layer deposition (ALD) process, an electroplating process, or the like. Other suitable deposition processes are within the contemplated scope of disclosure.

Figure 20:
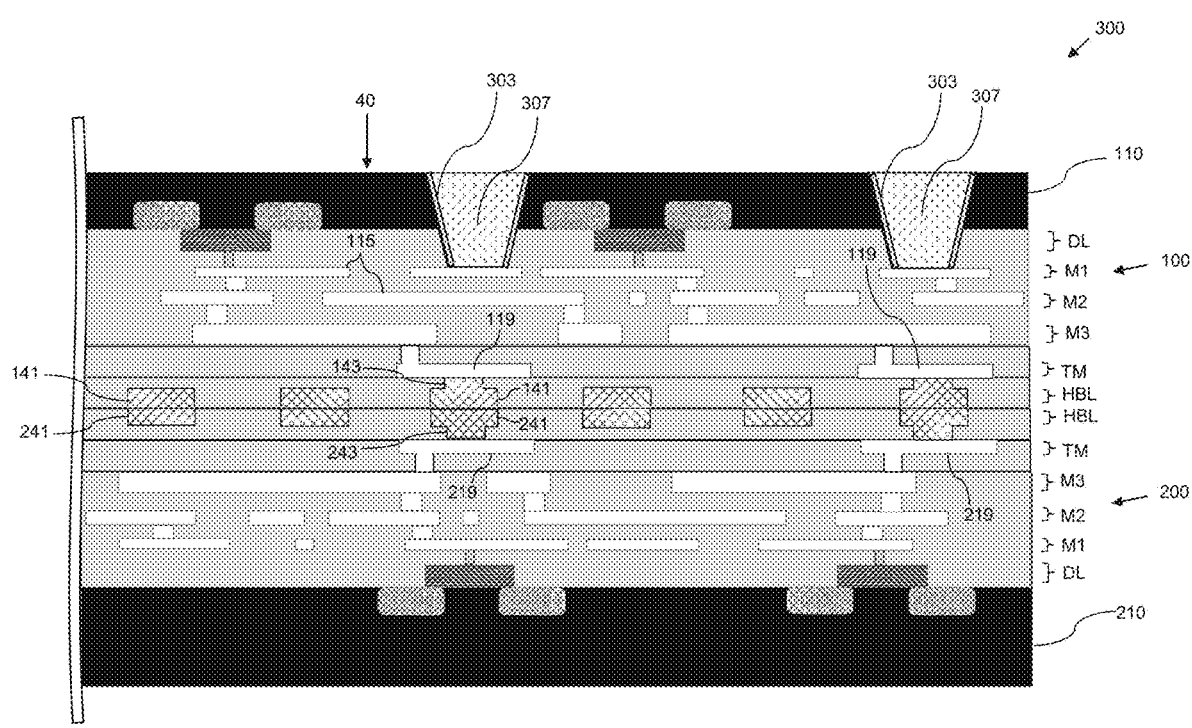
FIG. 20 is a vertical cross-section view of a bonded wafer structure including a plurality of through-substrate conductive vias formed in a first wafer according to an embodiment of the present disclosure.

FIG. 20 is a vertical cross-section view of the bonded wafer structure 300 including a plurality of through-substrate conductive vias 307 formed in the first wafer 100 according to an embodiment of the present disclosure. Referring to FIG. 20, the bonded wafer structure 300 may undergo a planarization process, such as a chemical mechanical planarization (CMP) process, to remove the layer of electrically conductive material 305 from over the backside 40 of the first substrate 110. The remaining electrically conductive material located within the openings 302 in the first wafer 100 may form through-substrate conductive vias 307. Each of the through-substrate conductive vias 307 may have an exposed upper surface and may be electrically connected to a metal feature (e.g., metal lines 115) in a metal level (e.g., M1) of the interconnect structure of the first wafer 100.

Figure 21:
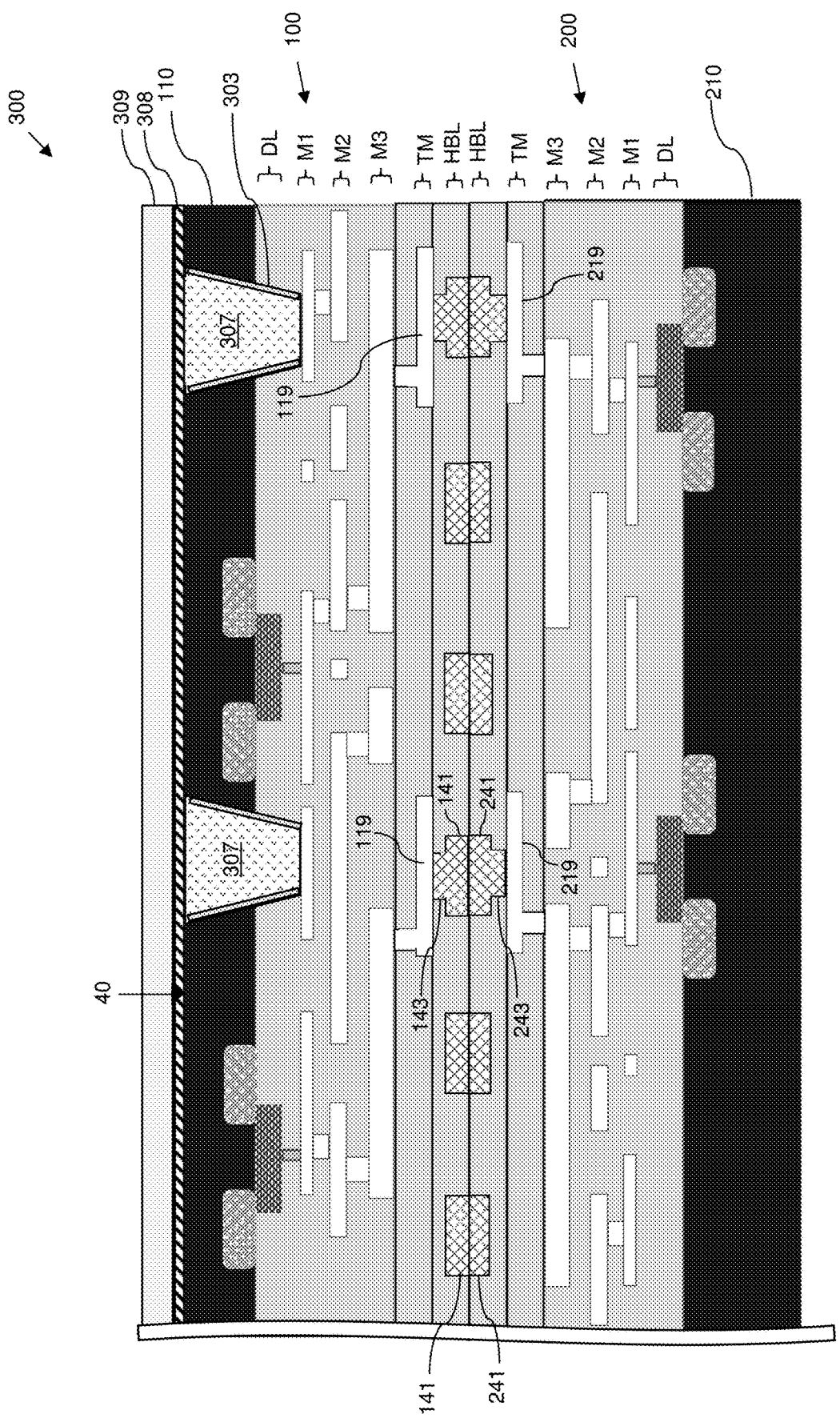
FIG. 21 is a vertical cross-section view of a bonded wafer structure including dielectric material layers deposited over a backside of a substrate of a first wafer and a plurality of through-substrate conductive vias according to an embodiment of the present disclosure.

FIG. 21 is a vertical cross-section view of the bonded wafer structure 300 including dielectric material layers 308, 309 deposited over the back side 40 of the first substrate 110 of the first wafer 100 according to an embodiment of the present disclosure. Referring to FIG. 21, dielectric material layer 308 may be deposited over the back side 40 of the first substrate 110 and over the exposed surfaces of the through-substrate conductive vias 307 using a suitable deposition method. Dielectric material layer 309 may then be deposited over the upper surface of dielectric material layer 308 using a suitable deposition method. In embodiments, dielectric material layers 308 and 309 may be passivation films for stress and/or moisture protection. In one embodiment, layer 308 may include a nitride material, such as silicon nitride, and layer 309 may include an oxide material, such as silicon oxide. Other suitable dielectric materials are within the contemplated scope of disclosure.

Figure 22:
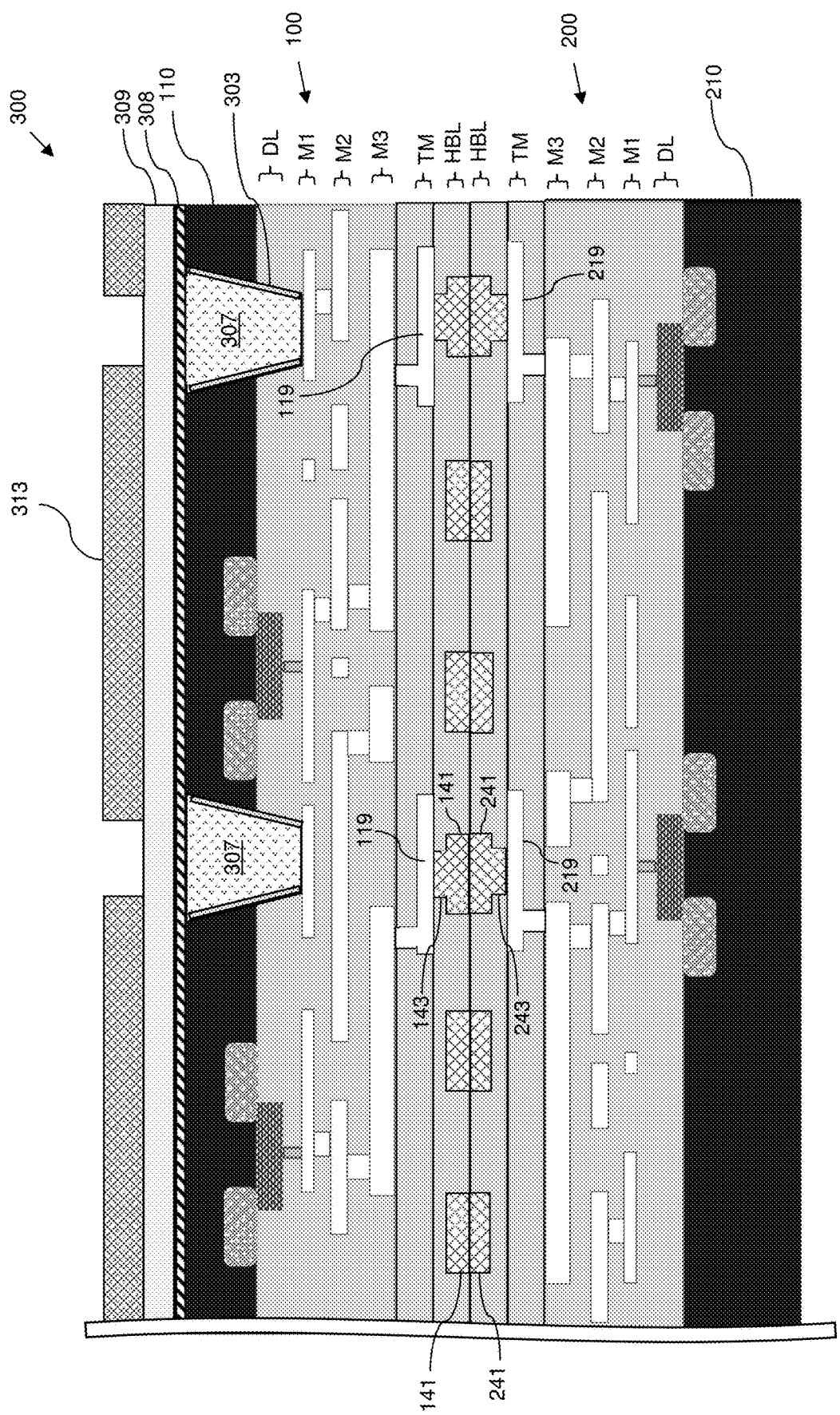
FIG. 22 is a vertical cross-section view of a bonded wafer structure including a patterned mask formed over dielectric material layers on a backside of a substrate of a first wafer according to an embodiment of the present disclosure.

FIG. 22 is a vertical cross-section view of the bonded wafer structure 300 including a patterned mask 313 formed over an upper surface of dielectric material layer 309 on the backside 40 of the first substrate 110 of the first wafer 100 according to an embodiment of the present disclosure. Referring to FIG. 22, patterned mask 313 may be lithographically patterned to form openings through the mask 313. The openings may correspond to the locations of through-substrate conductive vias 307 underlying the dielectric material layers 308 and 309.

Figure 23:
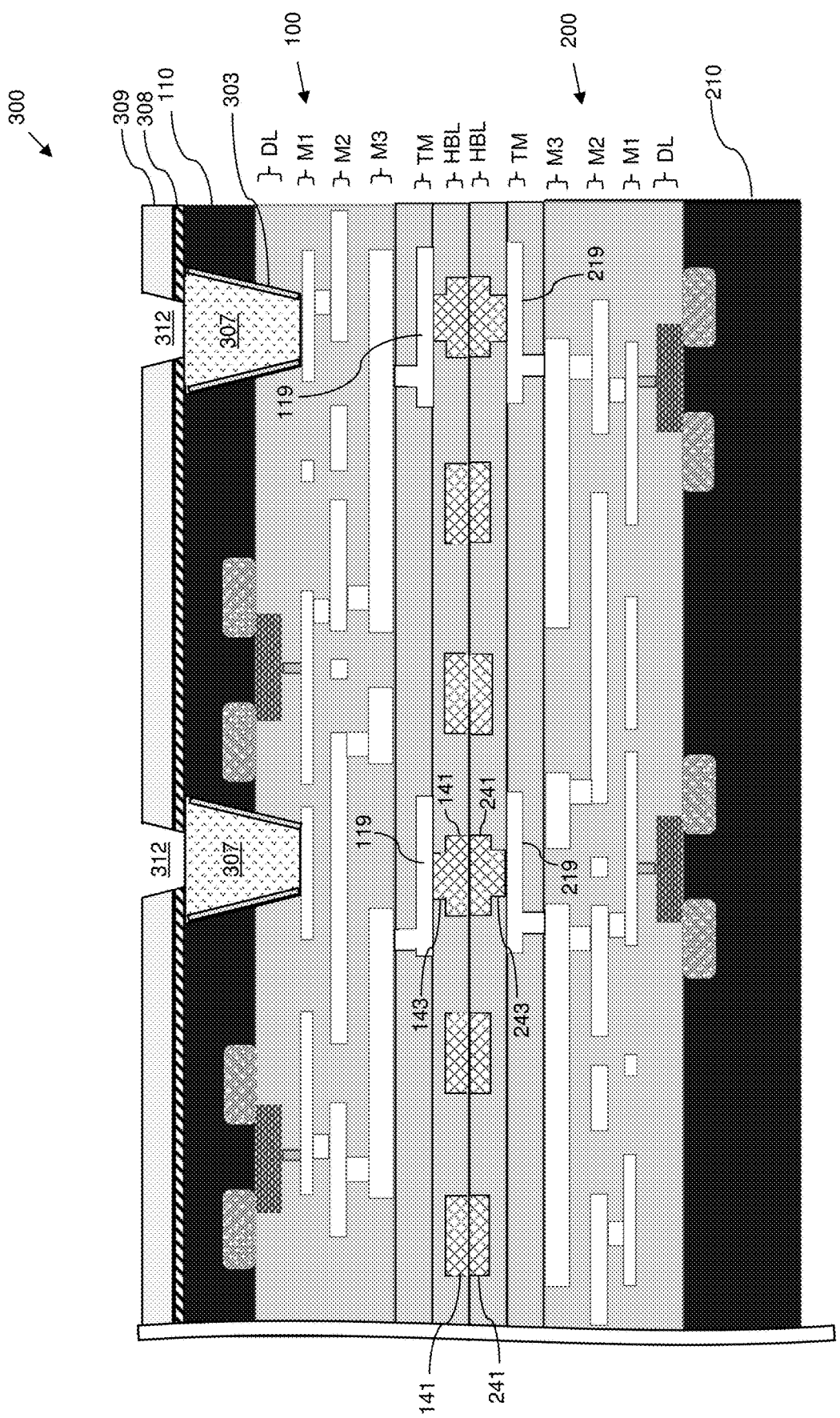
FIG. 23 is a vertical cross-section view of a bonded wafer structure including a plurality of openings formed through dielectric material layers to expose through-substrate conductive vias according to an embodiment of the present disclosure.

FIG. 23 is a vertical cross-section view of the bonded wafer structure 300 including a plurality of openings 312 formed through the dielectric material layers 308 and 309 to expose the upper surfaces of the through-substrate conductive vias 307 according to an embodiment of the present disclosure. Referring to FIG. 23, an anisotropic etch process may be performed through the patterned mask 313 to remove portions of dielectric material layers 308 and 309 and form openings 312 through the dielectric material layers 308 and 309. Each of the openings 312 may expose the upper surface of a respective through-substrate contact via 307. Following the etching process, the patterned mask 313 may be removed via a suitable process, such as by ashing or dissolution by a solvent.

Figure 24:
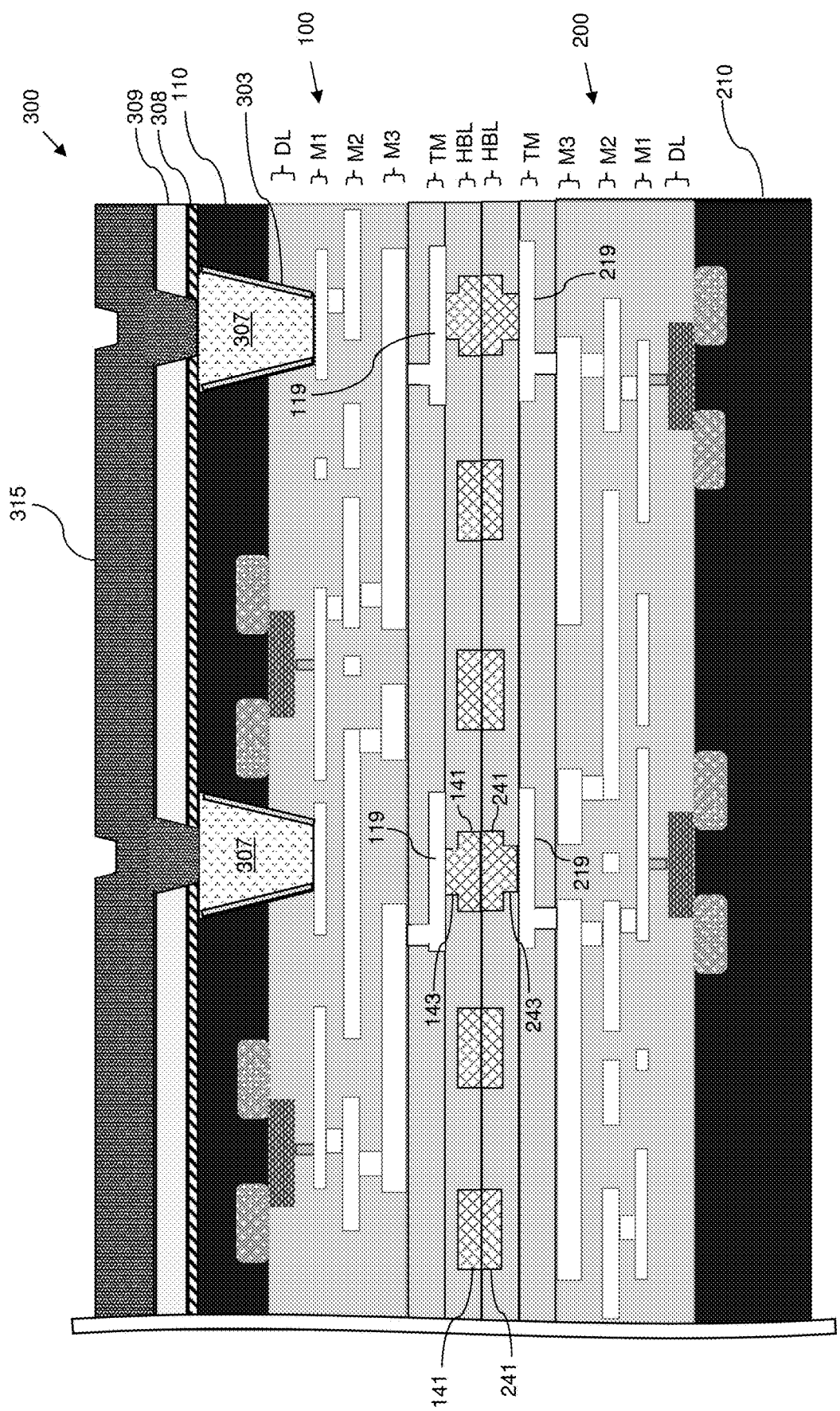
FIG. 24 is a vertical cross-section view of a bonded wafer structure including a layer of electrically conductive material deposited over dielectric material layers and within a plurality of openings through the dielectric material layers according to an embodiment of the present disclosure.

FIG. 24 is a vertical cross-section view of the bonded wafer structure 300 including a layer of electrically conductive material 315 deposited over the upper surface of dielectric layer 309 and within the openings 312 through the dielectric material layers 308 and 309 according to an embodiment of the present disclosure. Referring to FIG. 24, the layer of electrically conductive material 315 may be deposited over the upper surface of dielectric material layer 309 and over the sidewalls and the bottom surfaces of the openings 312 through dielectric material layers 308 and 309. The layer of electrically conductive material 315 may contact the exposed surfaces of the through-substrate conductive vias 307 at the bottom of each of the openings 312. In various embodiments, the layer of electrically conductive material 315 may include a metal material, such as copper (Cu), a copper alloy, aluminum (Al), an aluminum alloy, tungsten (W), and combinations thereof. Other electrically conductive materials are within the contemplated scope of disclosure. The layer of electrically conductive material 315 may be deposited using a suitable deposition process, which may include one or more of a chemical vapor deposition (CVD) process, a physical vapor deposition (PVD) process, an atomic layer deposition (ALD) process, an electroplating process, or the like. Other suitable deposition processes are within the contemplated scope of disclosure.

Figure 25:
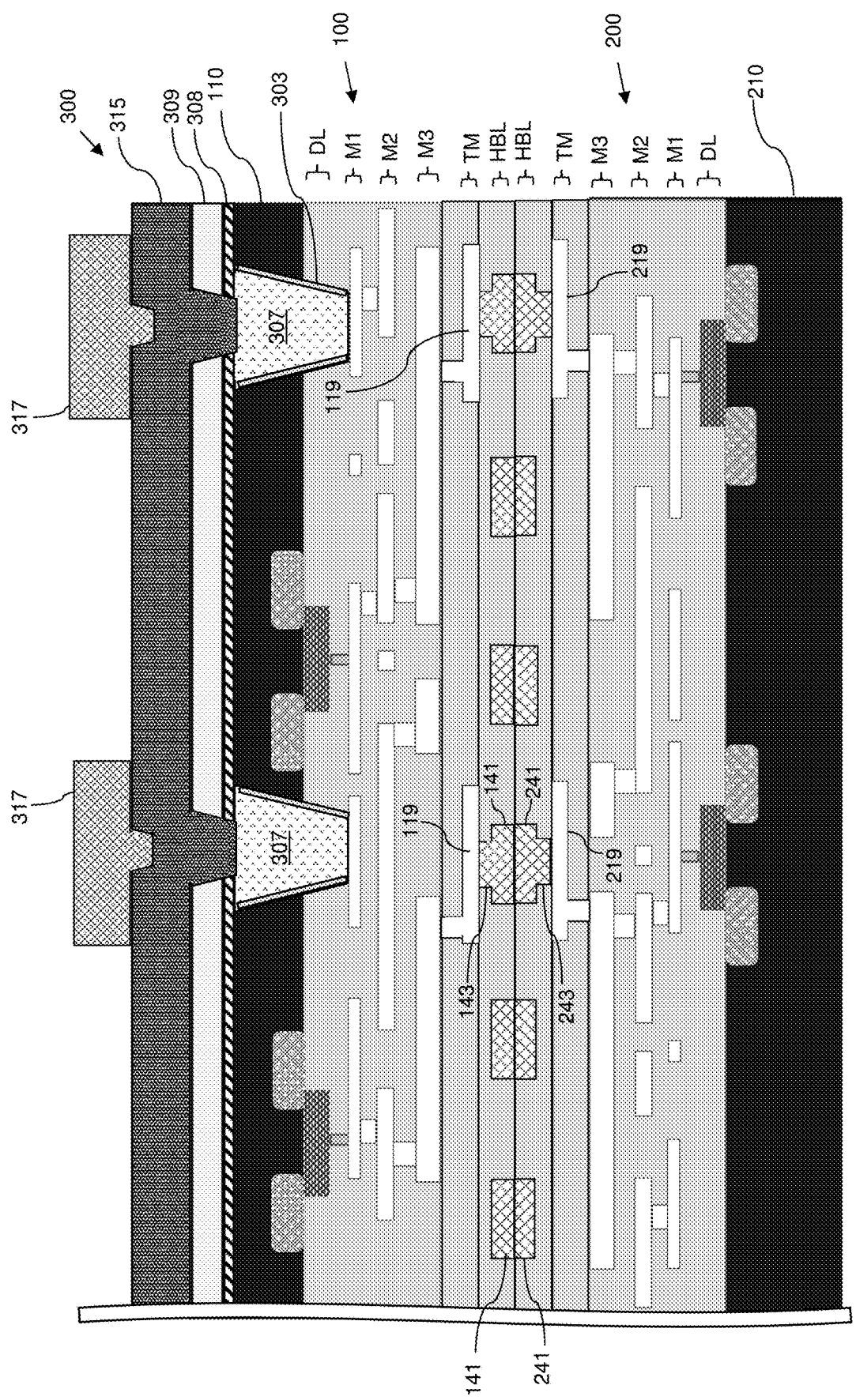
FIG. 25 is a vertical cross-section view of a bonded wafer structure including a patterned mask over a layer of electrically conductive material according to an embodiment of the present disclosure.

FIG. 25 is a vertical cross-section view of the bonded wafer structure 300 including a patterned mask 317 over the layer of electrically conductive material 315 according to an embodiment of the present disclosure. Referring to FIG. 25, the patterned mask 317 may be lithographically patterned to form openings through the mask 317. The mask 317 may cover portions of the layer of electrically conductive material 315 corresponding to the locations of contact pads that may be subsequently formed.

Figure 26:
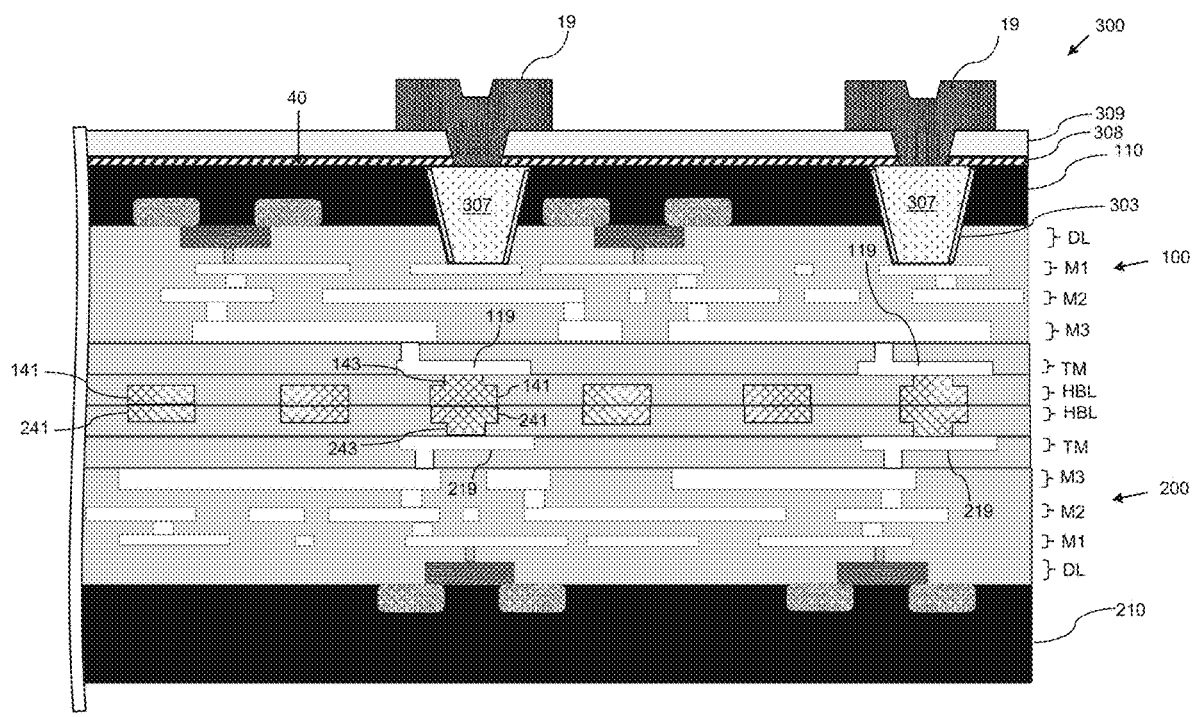
FIG. 26 is a vertical cross-section view of a bonded wafer structure including an array of contact pads of the bonded wafer structure located over a backside of a substrate of a first wafer according to an embodiment of the present disclosure.

FIG. 26 is a vertical cross-section view of the bonded wafer structure 300 including an array of contact pads 19 of the bonded wafer structure 300 located over a back side 40 of the first substrate 110 of the first wafer 100 according to an embodiment of the present disclosure. Referring to FIG. 26, an anisotropic etch process may be performed through the patterned mask 313 to remove portions of the layer of electrically conductive material 315 from above dielectric material layer 309. The remaining portions of the electrically conductive material 315 may form discrete contact pads 19 over the back side 40 of the first substrate 110. Following the etching process, the patterned mask 313 may be removed via a suitable process, such as by ashing or dissolution by a solvent.

Figure 27:
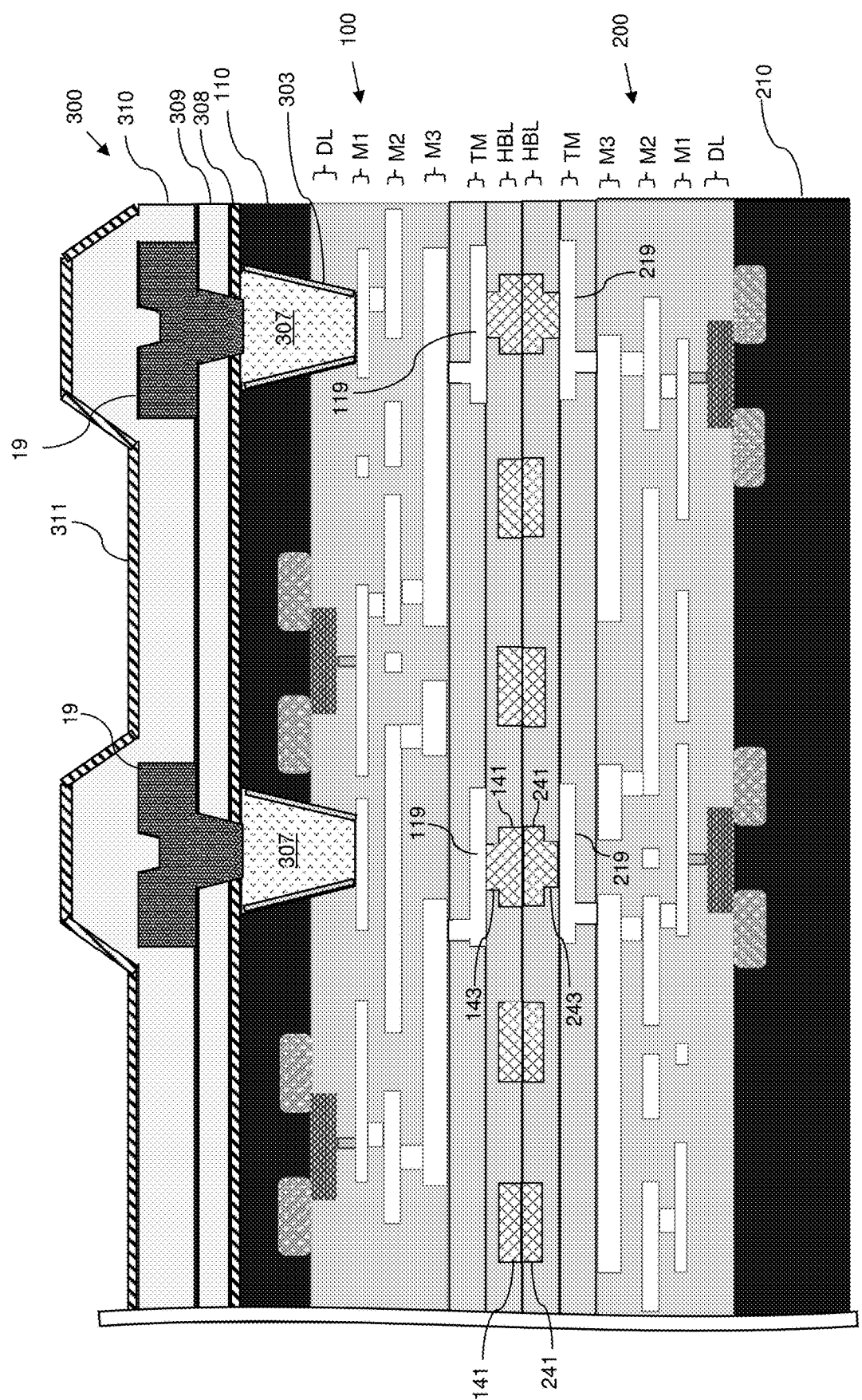
FIG. 27 is a vertical cross-section view of a bonded wafer structure including dielectric material layers deposited over a backside of a substrate of a first wafer and an array of contact pads of the bonded wafer structure according to an embodiment of the present disclosure.

FIG. 27 is a vertical cross-section view of the bonded wafer structure 300 including dielectric material layers 310 and 311 deposited over the back side 40 of the first substrate 110 of the first wafer 100 and the array of contact pads 19 of the bonded wafer structure 300 according to an embodiment of the present disclosure. Referring to FIG. 27, dielectric material layer 310 may be conformally deposited over dielectric material layer 309 and over the array of contact pads 19, including over the side surfaces and the upper surface of each of the contact pads 19. Dielectric material layer 311 may then be deposited over the upper surface of dielectric material layer 310. In embodiments, dielectric material layers 310 and 311 may be additional passivation films for stress and/or moisture protection. In one embodiment, layer 310 may include an oxide material, such as silicon oxide, and layer 311 may include nitride material, such as silicon nitride. Other suitable dielectric materials are within the contemplated scope of disclosure.

Figure 28:
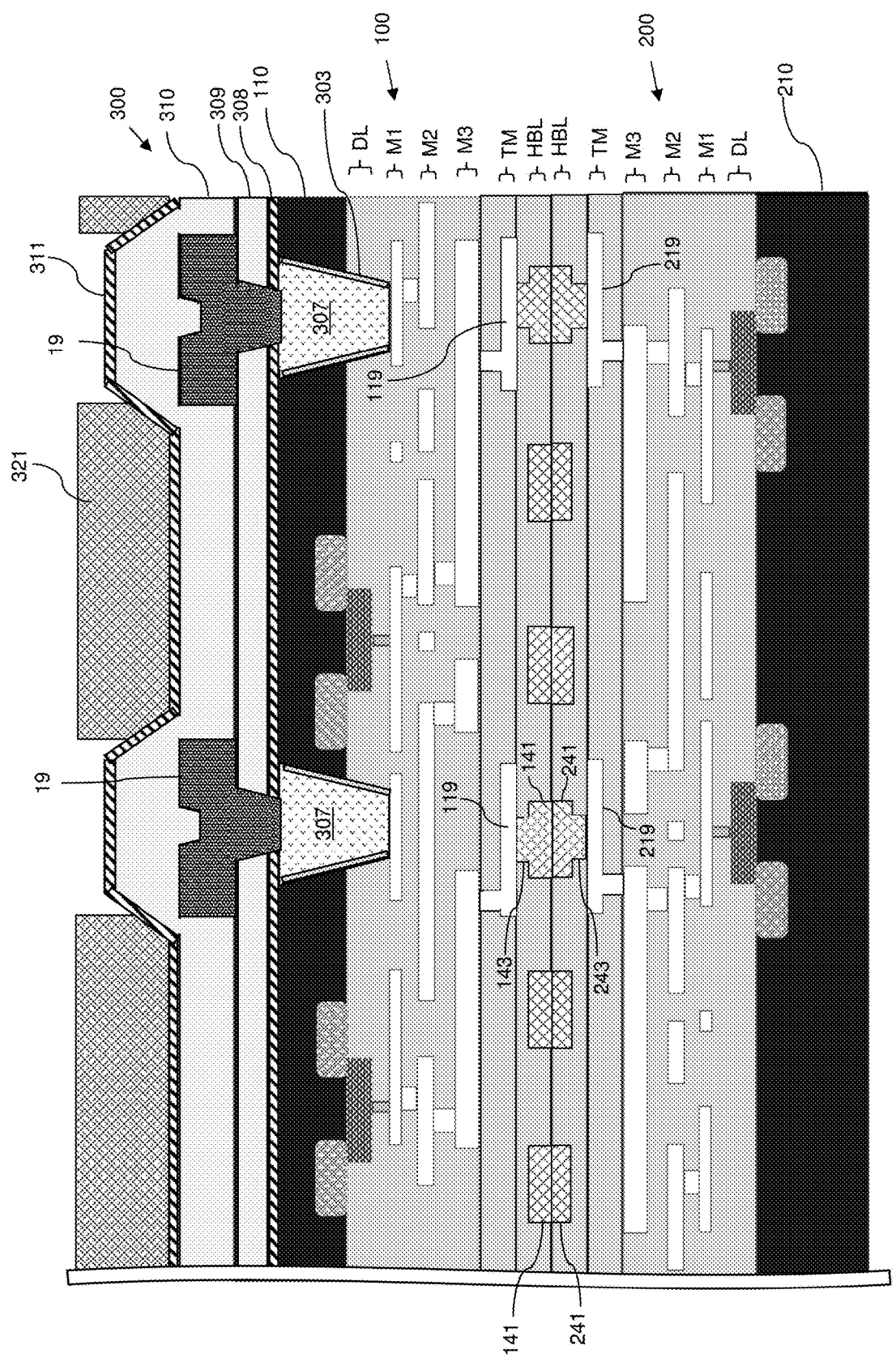
FIG. 28 is a vertical cross-section view of a bonded wafer structure including a patterned mask formed over dielectric material layers according to an embodiment of the present disclosure.

FIG. 28 is a vertical cross-section view of the bonded wafer structure 300 including a patterned mask 321 formed over dielectric material layers 309 and 310 according to an embodiment of the present disclosure. Referring to FIG. 28, the patterned mask 321 may be lithographically patterned to form openings through the mask 321. The openings may expose portions of dielectric material layer 309 located above a central region of each of the contact pads 19. The mask 321 may cover portions of the dielectric material layer 309 that are located over peripheral regions of the contact pads 19.

Figure 29:
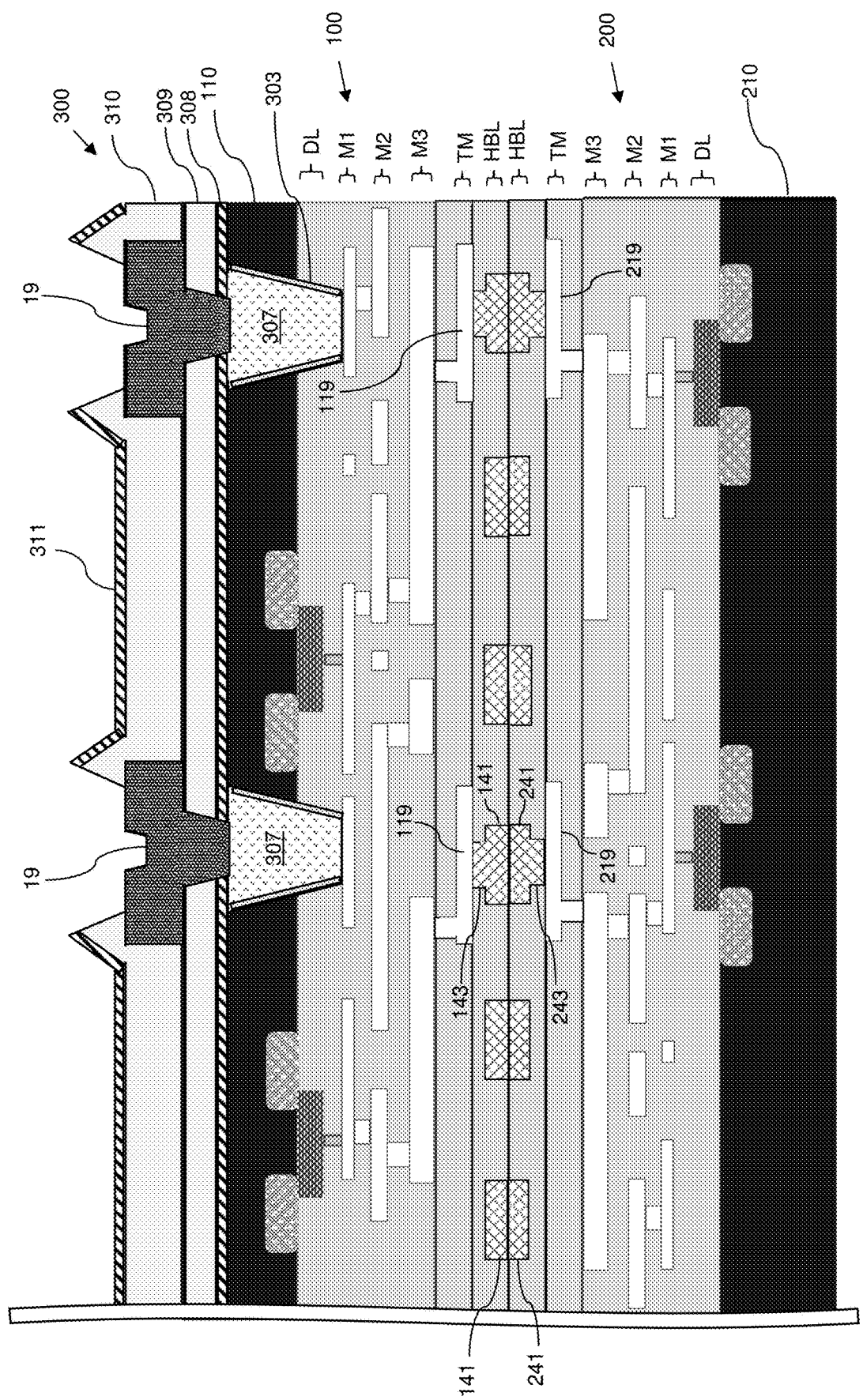
FIG. 29 is a vertical cross-section view of a bonded wafer structure including openings through dielectric material layers to expose respective contact surfaces of an array of contact pads of the bonded wafer structure according to an embodiment of the present disclosure.

FIG. 29 is a vertical cross-section view of the bonded wafer structure 300 including openings formed through dielectric material layers 310 and 311 to expose respective contact surfaces of an array of contact pads 19 of the bonded wafer structure 300 according to an embodiment of the present disclosure. Referring to FIG. 29, an anisotropic etch process may be performed through the patterned mask 321 to remove portions of the dielectric material layers 310 and 311 from above the upper surfaces of the contact pads 19 to expose contact surfaces of the contact pads 19. The dielectric material layers 310 and 311 may remain over the side surfaces and peripheral regions of the upper surfaces of the contact pads 19, as shown in FIG. 29. Following the etching process, the patterned mask 321 may be removed via a suitable process, such as by ashing or dissolution by a solvent. As discussed above, in various embodiments, the array pattern of the contact pads 19 of the bonded wafer structure 300 may correspond with the array pattern of top metal contact pads 127, 227 in an interconnect structure of at least one wafer 100, 200 of the bonded wafer structure 300.

Figure 30:
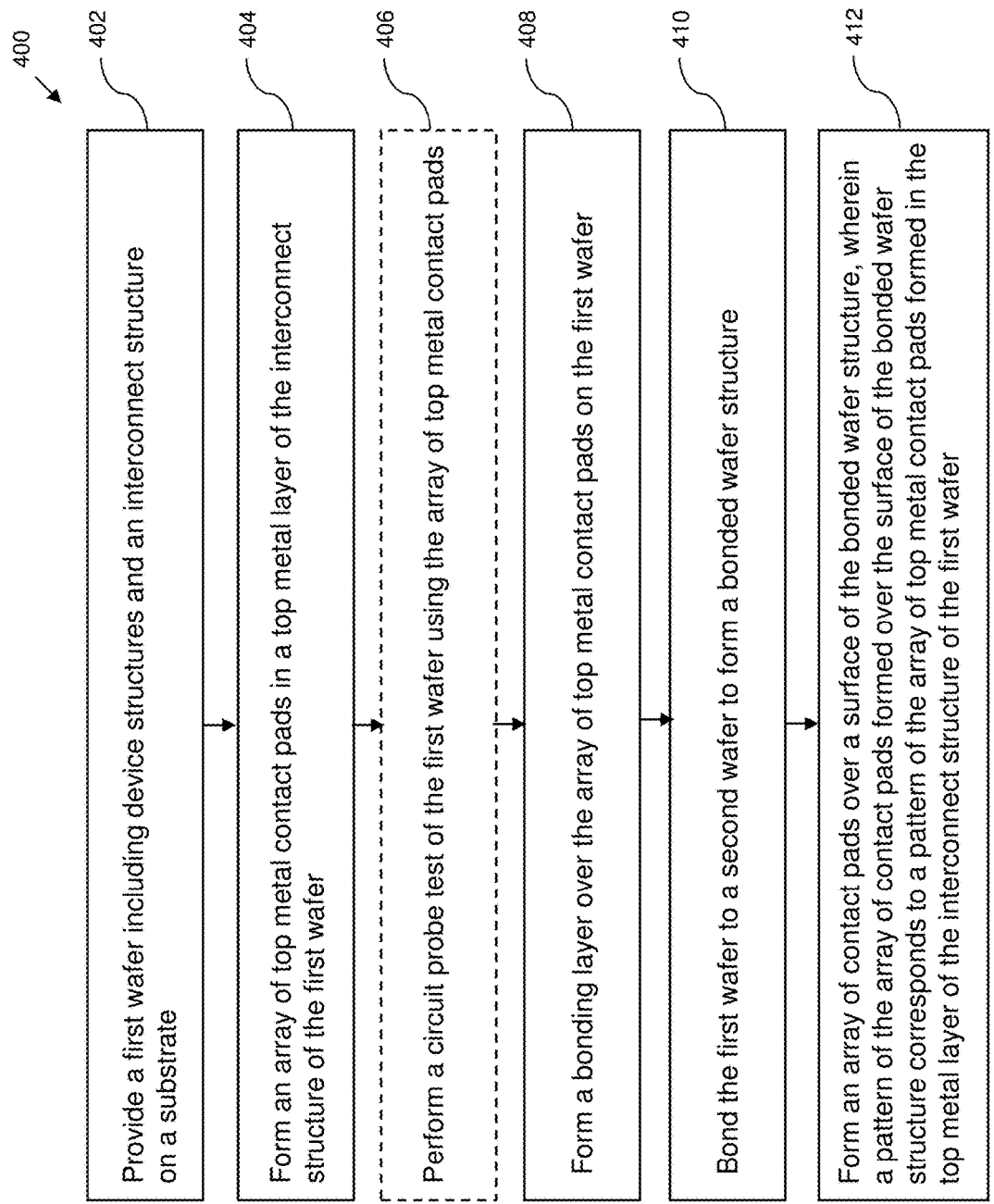
FIG. 30 is a flow chart illustrating steps of a method of forming a bonded wafer device structure according to various embodiments of the present disclosure.

FIG. 30 is a flow chart showing a method 400 of forming a bonded wafer structure 300 according to various embodiments of the present disclosure. Referring to FIGS. 1A, 1B and 30, in step 402 of method 400, a first wafer (100, 200) including device structures (112, 212) and an interconnect structure (111, 211, 113, 213, 115, 215, 117, 217) on a substrate (110, 210) may be provided. Referring to FIGS. 2A-9, in step 404 of method 400, an array of top metal contact pads (127, 227) may be formed in a top metal layer level TM of the interconnect structure of the first wafer (100, 200). In optional step 406 of method 400, a circuit probe test of the first wafer (100, 200) may be performed using the array of top metal contact pads (127, 227).

Referring to FIGS. 10A-14B, in step 408 of method 400, a bonding layer (BL) may be formed over the array of top metal contact pads (127, 227) on the first wafer (100, 200). Referring to FIGS. 15 and 30, in step 410 of method 400, the first wafer (100, 200) may be bonded to a second wafer (100, 200) to form a bonded wafer structure 300. Referring to FIGS. 16-30, in step 412 of method 400, an array of contact pads 19 may be formed over a surface 40 of the bonded wafer structure 300, wherein a pattern of the array of contact pads 19 formed over the surface 40 of the bonded wafer structure 300 corresponds to a pattern of the array of top metal contact pads (127, 227) formed in the top metal level TM of the interconnect structure of the first wafer (100, 200).

Referring to all drawings and according to various embodiments of the present disclosure, a bonded wafer structure 300 includes a first wafer 100 having a first substrate 110, first device structures 112 and a first interconnect structure (111, 113, 115, 117, 119), a second wafer 200 having a second substrate 210, second device structures 212 and a second interconnect structure (211, 213, 215, 217, 219) over a first surface 30 of the second substrate 210, where the second interconnect structure includes an array of top metal contact pads 227, a bonding layer (BL) between the array of top metal contact pads 227 and a first surface 30 of the first substrate 110, and an array of contact pads 19 over a second surface 40 of the first substrate 110, where the array of top metal contact pads 227 has an array pattern that corresponds with an array pattern of the contact pads 19 formed over the second surface 40 of the first substrate 110.

In an embodiment, each of the top metal contact pads includes length and width dimensions in a range from about 40 µm to about 100 µm.

In another embodiment, spatial coordinates of a geometric center point (C) of each contact pad 19 of the array of contact pads 19 formed over the second surface 40 of the first substrate 110 are within 5 µm of the spatial coordinates of a geometric center point (C) of each top metal contact pad 227 of the array of top metal contact pads 227 within a common frame of reference.

In another embodiment, at least some of the top metal contact pads 227 of the array of top metal contact pads 227 include slotted pads.

In another embodiment, each top metal contact pad 227 of the array of contact pads 227 is electrically connected to an underlying metal feature 215 of the second interconnect structure by a via structure 217.

In another embodiment, the second interconnect structure includes a top metal level (TM) including a plurality of metal features 219, wherein at least some of the plurality of metal features 219 include a contact pad region 127 and a second region 129 contiguous with the contact pad region 127.

In another embodiment, the contact pad regions 127 have length and width dimensions configured to enable circuit probe testing of the plurality of metal features 219.

In another embodiment, the second regions 129 of the plurality of metal features 219 contact a bonding link portion 243 that electrically connects the plurality of metal features 219 to the bonding layer (BL).

In another embodiment, the bonded wafer structure 300 further includes a plurality of through-substrate conductive vias 307 extending through the first substrate 110 and contacting a metal feature 115 of the first interconnect structure of the first wafer 100, where each contact pad 19 of the array of contact pads 19 over the second surface 40 of the first substrate 110 is electrically connected to a respective through-substrate conductive via 307.

In another embodiment, the bonding layer (BL) includes a plurality of bonding pads (141, 241) laterally surrounded by dielectric material (133, 233) and a plurality of bonding link portions (143, 243) that electrically connect the bonding pads to metal features (119, 219) of the first interconnect structure and the second interconnect structure.

In another embodiment, the bonding pads (141, 241) and the bonding link portions (143, 243) comprise copper.

In another embodiment, the bonded wafer structure 300 includes an additional array of top metal contact pads 127 in the first interconnect structure of the first wafer 100.

Another embodiment is drawn to a bonded wafer structure (300) including a first wafer 100 having a first substrate 110, first device structures 112 and a first interconnect structure (111, 113, 115, 117, 119), a second wafer 200 having a second substrate 210, second device structures 212 and a second interconnect structure (211, 213, 215, 217, 219) wherein the second interconnect structure includes a top metal level (TM) having a plurality of metal features 219 having a contact pad region 227 and a second region 129 contiguous with the contact pad region 227, wherein the contact pad region 227 has length and width dimensions configured for circuit probe testing of the second wafer 200, a bonding layer (BL) between the top metal level (TM) of the second interconnect structure and a first surface 30 of the first substrate 100, and an array of contact pads 19 over a second surface 40 of the first substrate 100.

In an embodiment, the contact pad regions 227 of the metal features 219 have length and width dimensions in a range from about 40 μm to about 100 μm, and the second regions 129 of the metal features 219 have a length and/or width dimension that is less than 40 μm.

In another embodiment, the second regions 129 of the metal features 219 contact bonding link portions 243 that electrically connect the metal features 219 to the bonding layer (BL).

In another embodiment, an array pattern of the contact pad regions 227 corresponds to an array pattern of the contact pads 19 over the second surface 40 of the first substrate 100.

Another embodiment is drawn to a method of forming a bonded wafer structure 300 that includes providing a first wafer (100, 200) including device structures (112, 212) and an interconnect structure (111, 211, 113, 213, 115, 215, 117, 217, 119, 219) on a first substrate 100, forming an array of top metal contact pads (127, 227) in a top metal level TM of the interconnect structure of the first wafer (100, 200), forming a bonding layer (BL) over the array of top metal contact pads (127, 227), bonding the first wafer (100, 200) to a second wafer (100, 200) to form a bonded wafer structure 300, and forming an array of contact pads 19 over a surface of the bonded wafer structure 300, where a pattern of the array of contact pads 19 formed over the surface of the bonded wafer structure 300 corresponds to a pattern of the array of top metal contact pads (127, 227) formed in the top metal level TM of the interconnect structure of the first wafer (100, 200).

In an embodiment, the method further includes performing a circuit probe test of the first wafer (100, 200) using the array of top metal contact pads (127, 227) prior to forming the bonding layer (BL) over the array of top metal contact pads (127, 227).

In another embodiment, the bonding layer (BL) comprises a first bonding layer, the second wafer (100, 200) includes a second bonding layer (BL) over a second substrate (110, 210), and where bonding the first wafer (100, 200) to the second wafer (100, 200) includes stacking the first wafer (100, 200) and the second wafer (100, 200) such that bonding pads (141, 241) of the first bonding layer (BL) contact bonding pads (141, 241) of the second bonding layer (BL), and diffusion bonding the bonding pads (141, 242) to bond the first wafer (100, 200) to the second wafer (100, 200).

In another embodiment, the step of forming an array of contact pads 19 over a surface of the bonded wafer structure 300 includes forming through-substrate conductive vias 307 through the second substrate (110, 210) and forming contact pads 19 over a back side 40 of the second substrate (110, 210), where each contact pad 19 contacts a respective through-substrate conductive via 307.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonded wafer structure, comprising:
a first wafer comprising a first substrate, first device structures and a first interconnect structure;
a second wafer comprising a second substrate, second device structures and a second interconnect structure over a first surface of the second substrate, wherein the second interconnect structure comprises an array of top metal contact pads;
a bonding layer between the array of top metal contact pads and a first surface of the first substrate; and
an array of contact pads over a second surface of the first substrate, wherein the array of top metal contact pads comprises an array pattern that corresponds with an array pattern of contact pads formed over the second surface of the first substrate, wherein spatial coordinates of a geometric center point of each contact pad of the array of contact pads formed over the second surface of the first substrate are within 5 μm of the spatial coordinates of a geometric center point of each top metal contact pad of the array of top metal contact pads within a common frame of reference.

2. The bonded wafer structure of claim 1, wherein each of the top metal contact pads includes length and width dimensions in a range from about 40 μm to about 100 μm.

3. The bonded wafer structure of claim 1, wherein at least some of the top metal contact pads of the array of top metal contact pads comprise slotted pads.

4. The bonded wafer structure of claim 1, wherein each top metal contact pad of the array of top metal contact pads is electrically connected to an underlying metal feature of the second interconnect structure by a via structure.

5. The bonded wafer structure of claim 1, wherein the second interconnect structure comprises a top metal level including a plurality of metal features, wherein at least some of the plurality of metal features comprise a contact pad region and a second region contiguous with the contact pad region.

6. The bonded wafer structure of claim 5, wherein the contact pad regions have length and width dimensions configured to enable circuit probe testing of the plurality of metal features.

7. The bonded wafer structure of claim 5, wherein the second region of the metal features contact a bonding link portion that electrically connects the metal features to the bonding layer.

8. The bonded wafer structure of claim 1, further comprising:
a plurality of through-substrate conductive vias extending through the first substrate and contacting a metal feature of the first interconnect structure of the first wafer, wherein each contact pad of the array of contact pads over the second surface of the first substrate is electrically connected to a respective through-substrate conductive via.

9. The bonded wafer structure of claim 1, wherein the bonding layer comprises a plurality of bonding pads laterally surrounded by dielectric material and a plurality of bonding link portions that electrically connect the plurality of bonding pads to the plurality of metal features of the first interconnect structure and the second interconnect structure.

10. The bonded wafer structure of claim 9, wherein the plurality of bonding pads and the plurality of bonding link portions comprise copper.

11. The bonded wafer structure of claim 1, further comprising an additional array of top metal contact pads in the first interconnect structure of the first wafer.

12. A bonded wafer structure, comprising:
a first wafer comprising a first substrate, first device structures and a first interconnect structure;
a second wafer comprising a second substrate, second device structures and a second interconnect structure, wherein the second interconnect structure comprises a top metal level comprising a plurality of metal features having a contact pad region and a second region contiguous with the contact pad region, wherein the contact pad region has length and width dimensions configured for circuit probe testing of the second wafer;
a bonding layer between the top metal level of the second interconnect structure and a first surface of the first substrate, wherein the second regions of the plurality of metal features of the top metal level of the second interconnect structure contact bonding link portions that electrically connect the metal features to the bonding layer; and
an array of contact pads over a second surface of the first substrate.

13. The bonded wafer structure of claim 12, wherein the contact pad regions of the metal features have length and width dimensions in a range from about 40 μm to about 100 μm and the second regions of the plurality of metal features have a length and/or width dimension that is less than 40 μm.

14. The bonded wafer structure of claim 12, wherein an array pattern of the contact pad regions corresponds to an array pattern of the contact pads over the second surface of the first substrate.

15. A method of forming a bonded wafer structure, comprising:
providing a first wafer comprising device structures and an interconnect structure on a first substrate;
forming an array of top metal features in a top metal level of the interconnect structure of the first wafer, each of the top metal features comprising a contact pad region and a second region contiguous with the contact pad region, and the contact pad region has length and width dimensions configured for circuit probe testing of the first wafer;
forming a bonding layer over the array of top metal features, wherein the second regions of the array of top metal features electrically contact bonding link portions that electrically connect the top metal features to the bonding layer;
bonding the first wafer to a second wafer to form a bonded wafer structure; and
forming an array of contact pads over a surface of the bonded wafer structure, wherein a pattern of the array of contact pads formed over the surface of the bonded wafer structure corresponds to a pattern of the contact pad regions of the array of top metal features formed in the top metal level of the interconnect structure of the first wafer.

16. The method of claim 15, further comprising:
performing a circuit probe test of the first wafer using the contact pad regions of the array of top metal features prior to forming the bonding layer over the array of top metal features.

17. The method of claim 15, wherein the bonding layer comprises a first bonding layer, the second wafer includes a second bonding layer over a second substrate, and wherein bonding the first wafer to the second wafer comprises stacking the first wafer and the second wafer such that bonding pads of the first bonding layer contact bonding pads of the second bonding layer, and diffusion bonding the bonding pads to bond the first wafer to the second wafer.

18. The method of claim 17, wherein forming an array of contact pads over a surface of the bonded wafer structure comprises forming through-substrate conductive vias through the second substrate and forming contact pads over a back side of the second substrate, wherein each contact pad contacts a respective through-substrate conductive via.

19. The bonded wafer structure of claim 13, wherein at least one second region of the plurality of metal features has a length dimension that is greater than 100 μm.

20. The method of claim 16, further comprising:
performing a circuit probe test of the array of contact pads over the surface of the bonded wafer structure using the same probe card that was used to perform the circuit probe test of the first wafer prior to forming the bonding layer over the array of top metal features.

* * * * *